US009508853B2

(12) United States Patent
Jacob et al.

(10) Patent No.: US 9,508,853 B2
(45) Date of Patent: Nov. 29, 2016

(54) CHANNEL CLADDING LAST PROCESS FLOW FOR FORMING A CHANNEL REGION ON A FINFET DEVICE HAVING A REDUCED SIZE FIN IN THE CHANNEL REGION

(71) Applicant: GLOBALFOUNDRIES Inc., Grand Cayman (KY)

(72) Inventors: Ajey Poovannummoottil Jacob, Watervliet, NY (US); Witold P. Maszara, Morgan Hill, CA (US); Jody A. Fronheiser, Delmar, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/073,936

(22) Filed: Mar. 18, 2016

(65) Prior Publication Data
US 2016/0204261 A1 Jul. 14, 2016

Related U.S. Application Data

(63) Continuation of application No. 14/560,361, filed on Dec. 4, 2014, now Pat. No. 9,362,405.

(51) Int. Cl.
  *H01L 29/66* (2006.01)
  *H01L 29/78* (2006.01)
  *H01L 21/3213* (2006.01)
  (Continued)

(52) U.S. Cl.
  CPC ..... *H01L 29/7851* (2013.01); *H01L 21/02381* (2013.01); *H01L 21/02532* (2013.01); *H01L 21/02546* (2013.01); *H01L 21/02549* (2013.01); *H01L 21/30604* (2013.01); *H01L 21/32133* (2013.01); *H01L 29/1054* (2013.01); *H01L 29/161* (2013.01); *H01L 29/201* (2013.01); *H01L 29/51* (2013.01); *H01L 29/6656* (2013.01); *H01L 29/6681* (2013.01); *H01L 29/66545* (2013.01); *H01L 29/66553* (2013.01); *H01L 29/66795* (2013.01); *H01L 29/7848* (2013.01)

(58) Field of Classification Search
  CPC ............. H01L 29/7851; H01L 29/201; H01L 21/02549; H01L 21/02546; H01L 21/32133; H01L 29/161; H01L 29/6656; H01L 29/6681; H01L 21/02532; H01L 21/02381; H01L 29/7848
  See application file for complete search history.

(56) References Cited

U.S. PATENT DOCUMENTS 8,193,567 B2 * 6/2012 Kavalieros ...... H01L 21/823431
                                                        257/288
8,263,451 B2   9/2012 Su et al.
(Continued)

*Primary Examiner* — Jessica Manno
*Assistant Examiner* — Mohammed R Alam
(74) *Attorney, Agent, or Firm* — Amerson Law Firm, PLLC

(57) ABSTRACT

One method of forming epi semiconductor cladding materials in the channel region of a semiconductor device is disclosed which includes forming a sacrificial gate structure around a portion of an initial fin, forming a sidewall spacer adjacent opposite sides of the sacrificial gate structure and removing the sacrificial gate structure so as to thereby define a replacement gate cavity, performing an etching process through the replacement gate cavity to remove portions of the initial fin so as to thereby define a reduced size fin and recesses under the sidewall spacers, forming at least one replacement epi semiconductor cladding material around the reduced size fin in the replacement gate cavity and in the recesses under the sidewall spacers, and forming a replacement gate structure within the replacement gate cavity around the at least one replacement epi semiconductor cladding material.

18 Claims, 26 Drawing Sheets

(51) Int. Cl.

| | | |
|---|---|---|
| *H01L 21/02* | (2006.01) |
| *H01L 29/161* | (2006.01) |
| *H01L 29/201* | (2006.01) |
| *H01L 21/306* | (2006.01) |
| *H01L 29/10* | (2006.01) |
| *H01L 29/51* | (2006.01) |

(56) References Cited

U.S. PATENT DOCUMENTS

2009/0206406 A1    8/2009    Rachmady et al.
2012/0032230 A1    2/2012    Yin et al.
2012/0319211 A1    12/2012    van Dal et al.
2013/0056827 A1*    3/2013    Tsai ................ H01L 29/66795
                                                                           257/347
2013/0065371 A1*    3/2013    Wei ................ H01L 21/76224
                                                                           438/294
2013/0193446 A1    8/2013    Chao et al.
2015/0255567 A1    9/2015    Basu et al.
2015/0255568 A1*    9/2015    Basu ................ H01L 29/785
                                                                           257/192

\* cited by examiner

X-SECTION THROUGH GATE IN GW DIRECTION

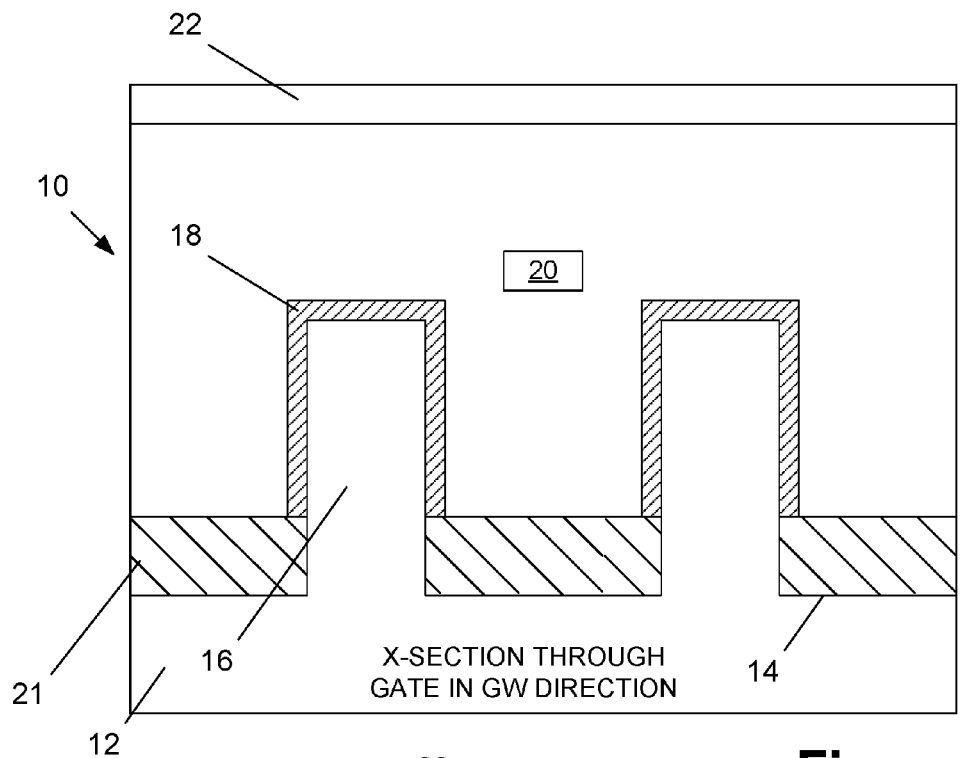
Figure 2D
(Prior Art)
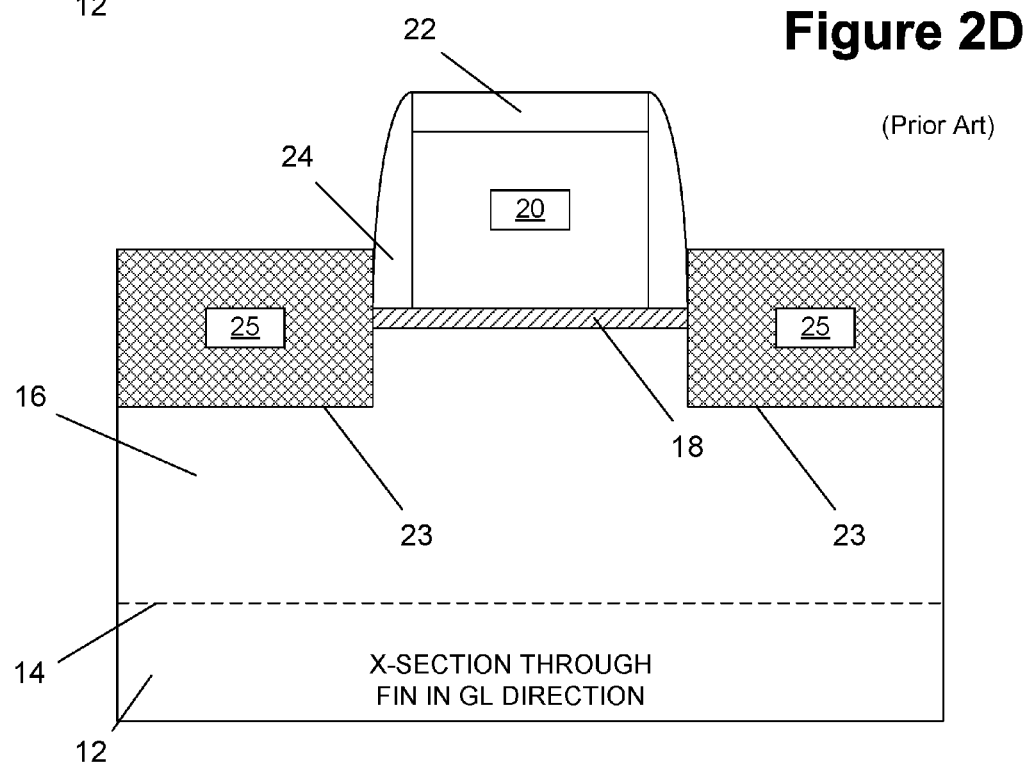

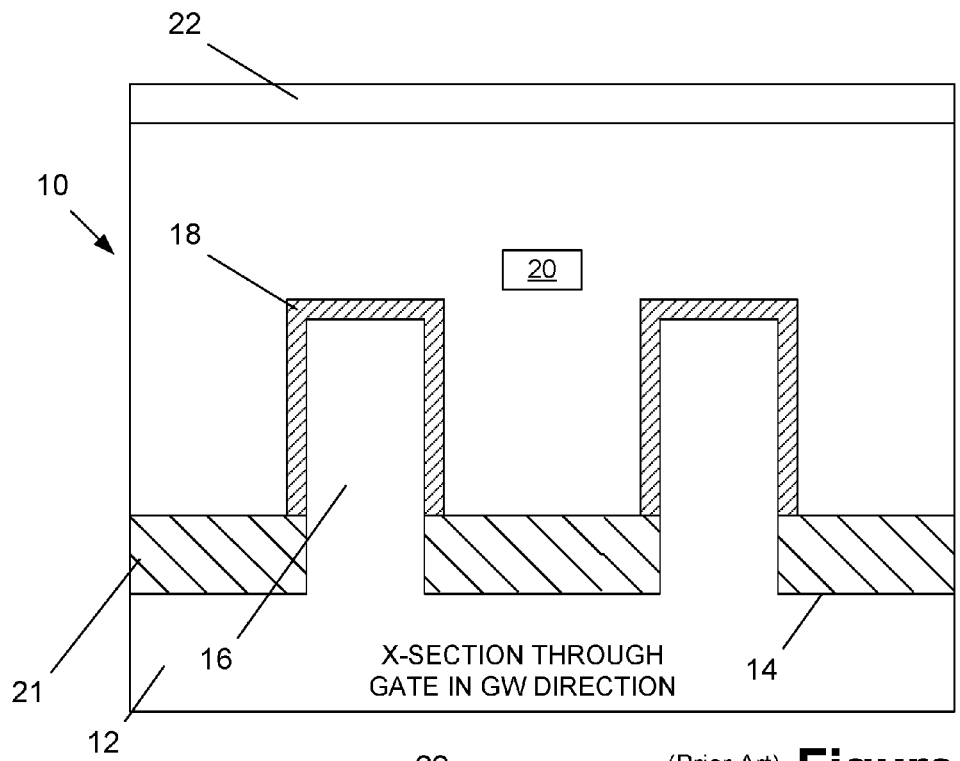
X-SECTION THROUGH GATE IN GW DIRECTION
(Prior Art) Figure 2E
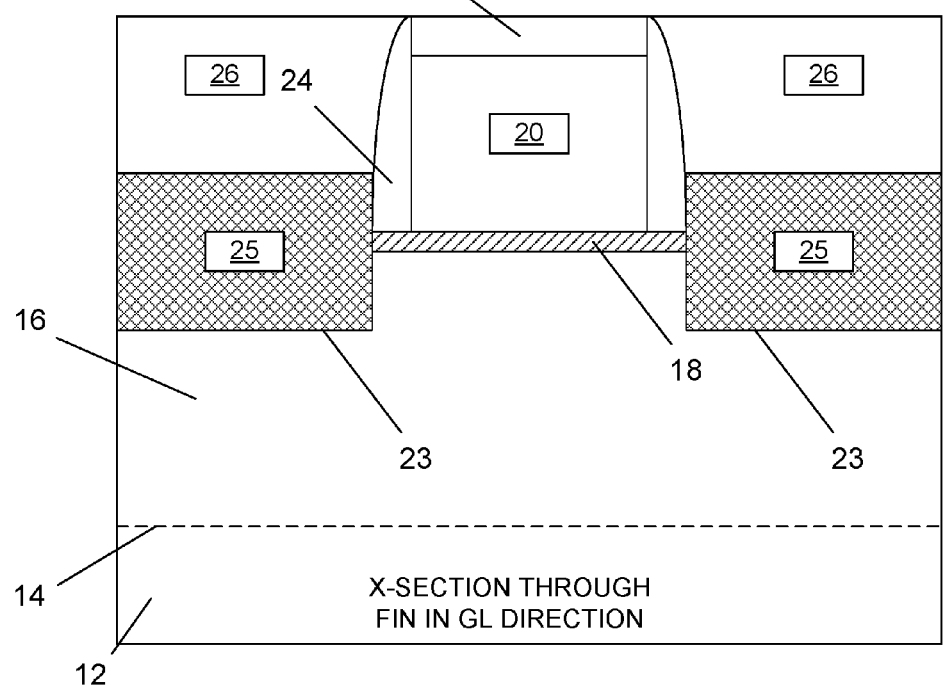
X-SECTION THROUGH FIN IN GL DIRECTION

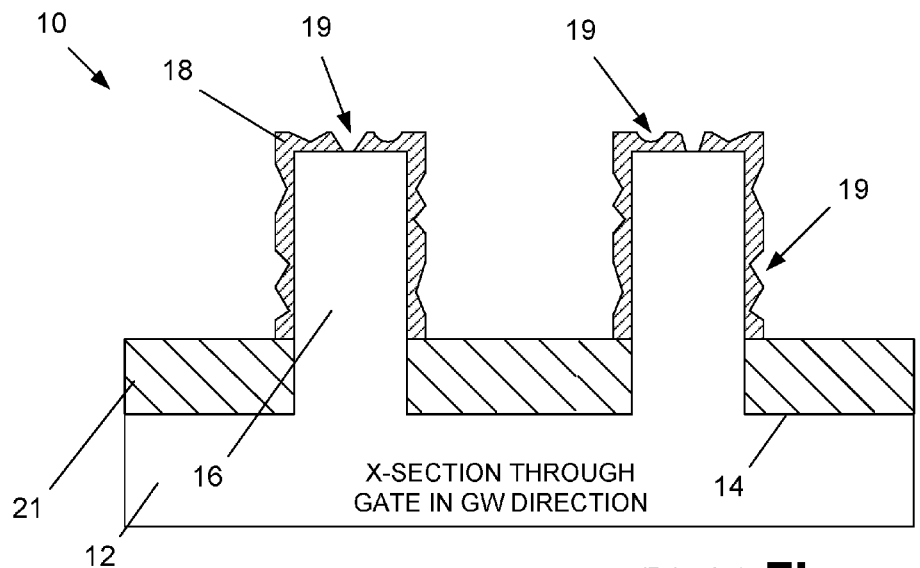
(Prior Art) Figure 2F
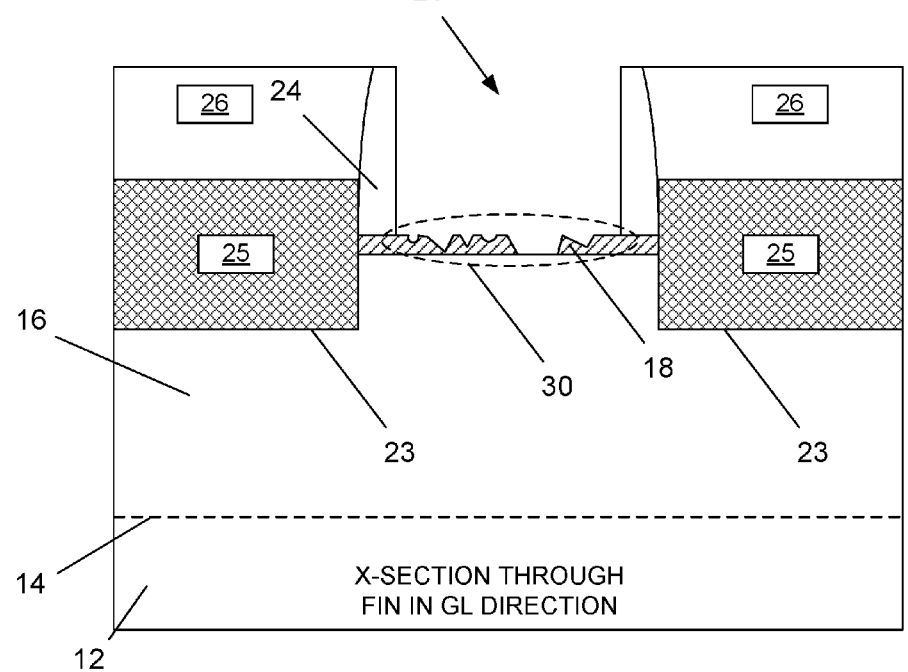

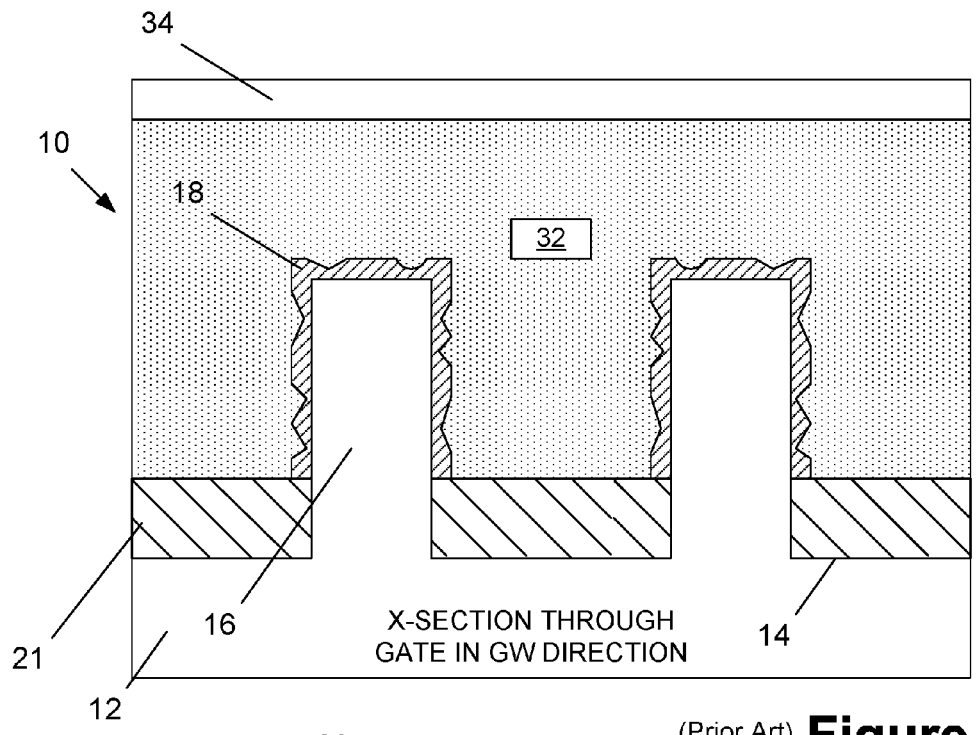
(Prior Art) Figure 2G
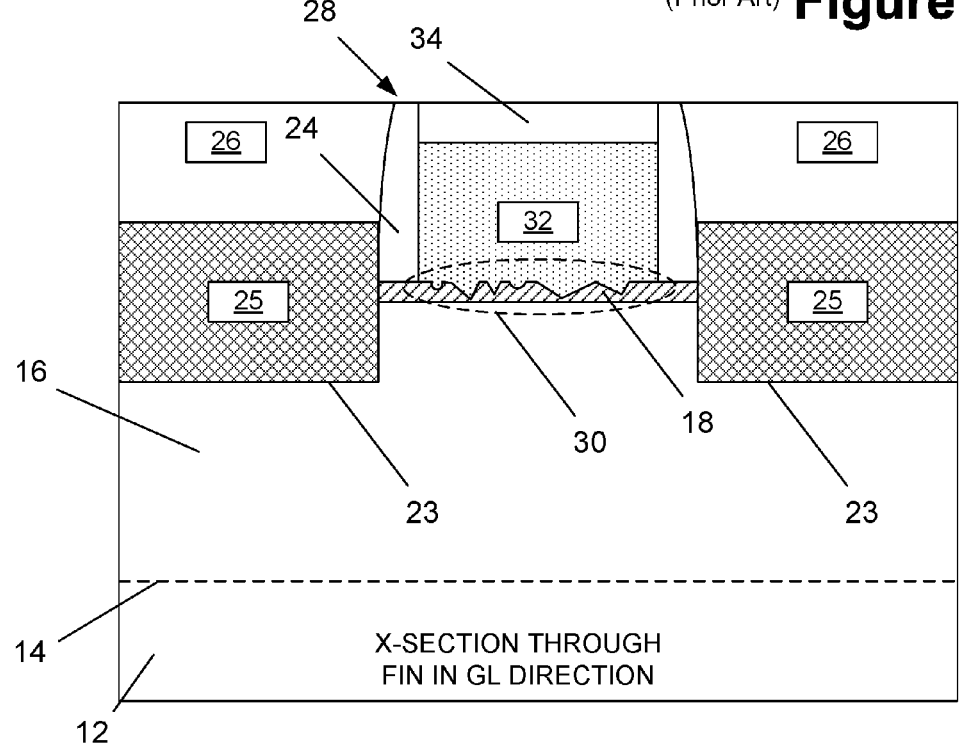

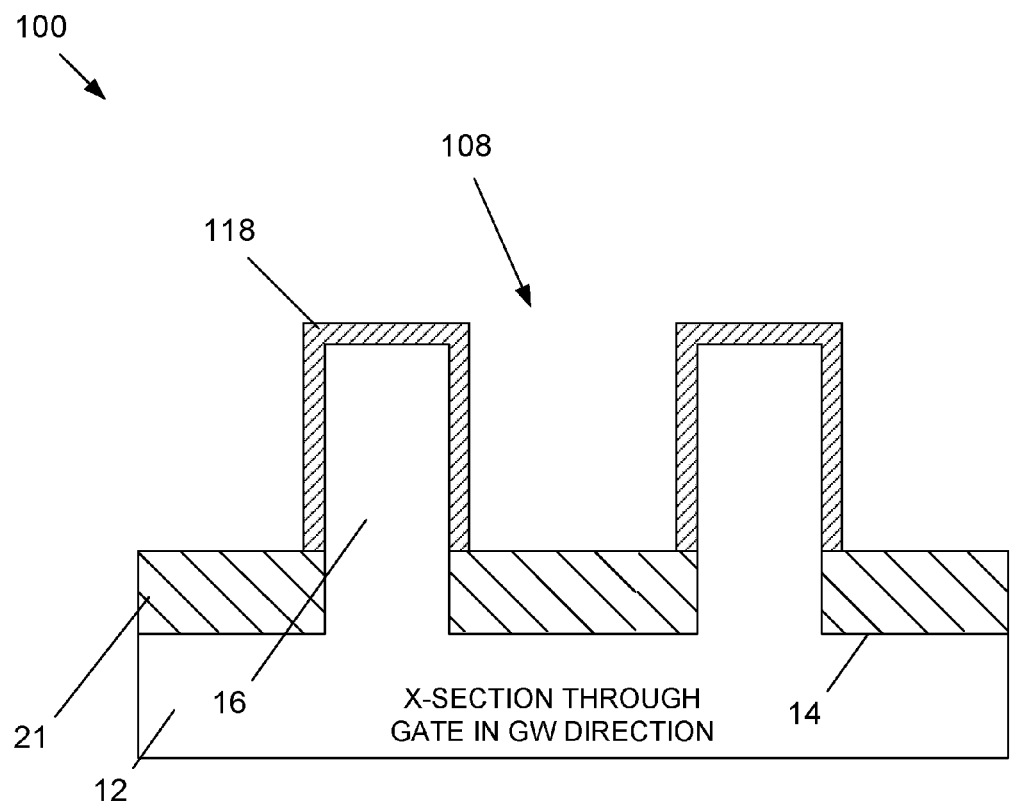
Figure 3C
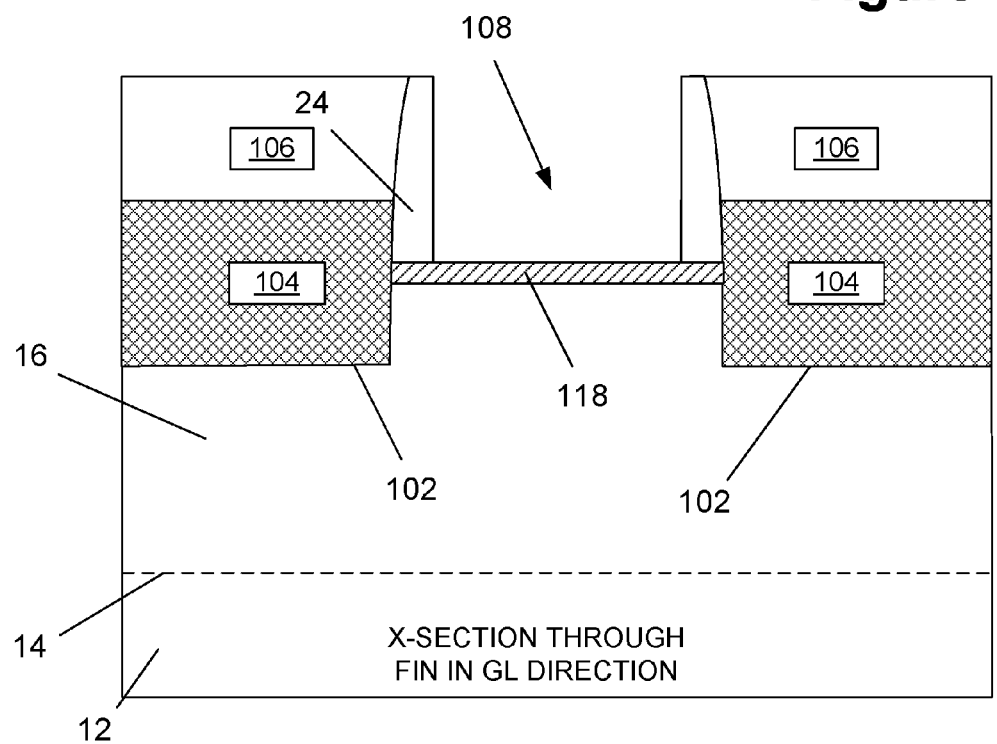

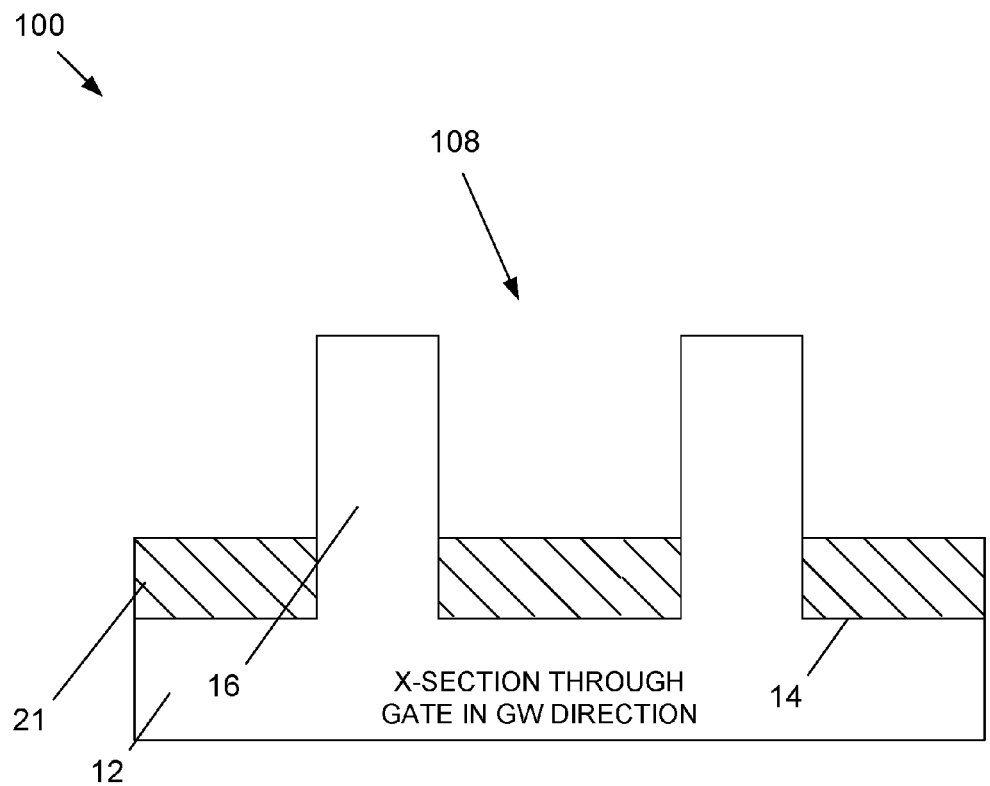
Figure 3D
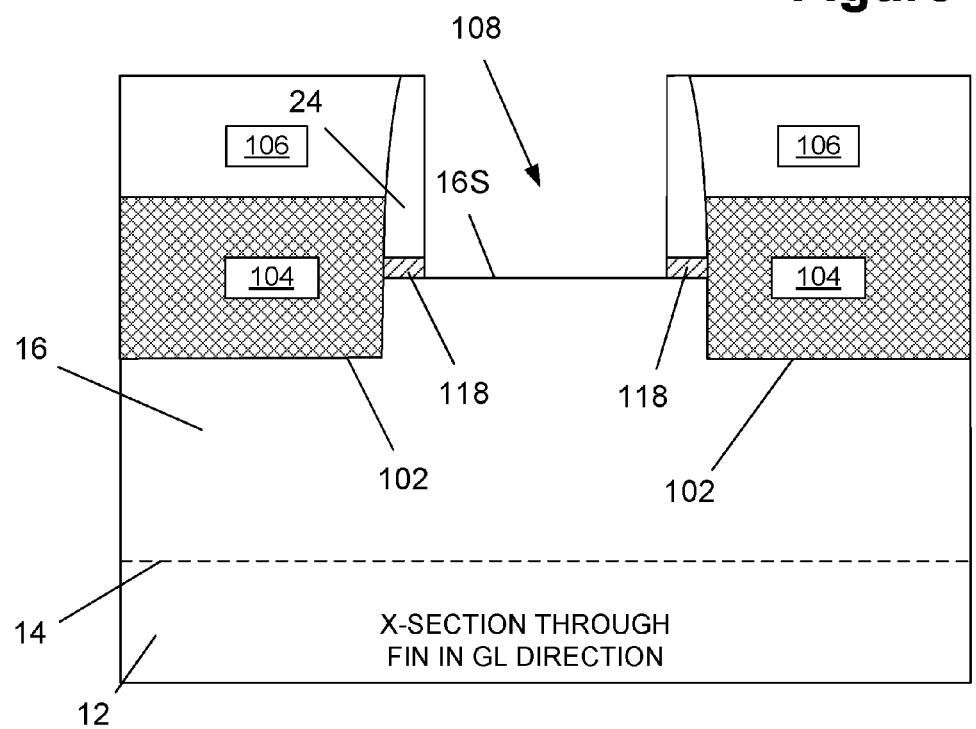

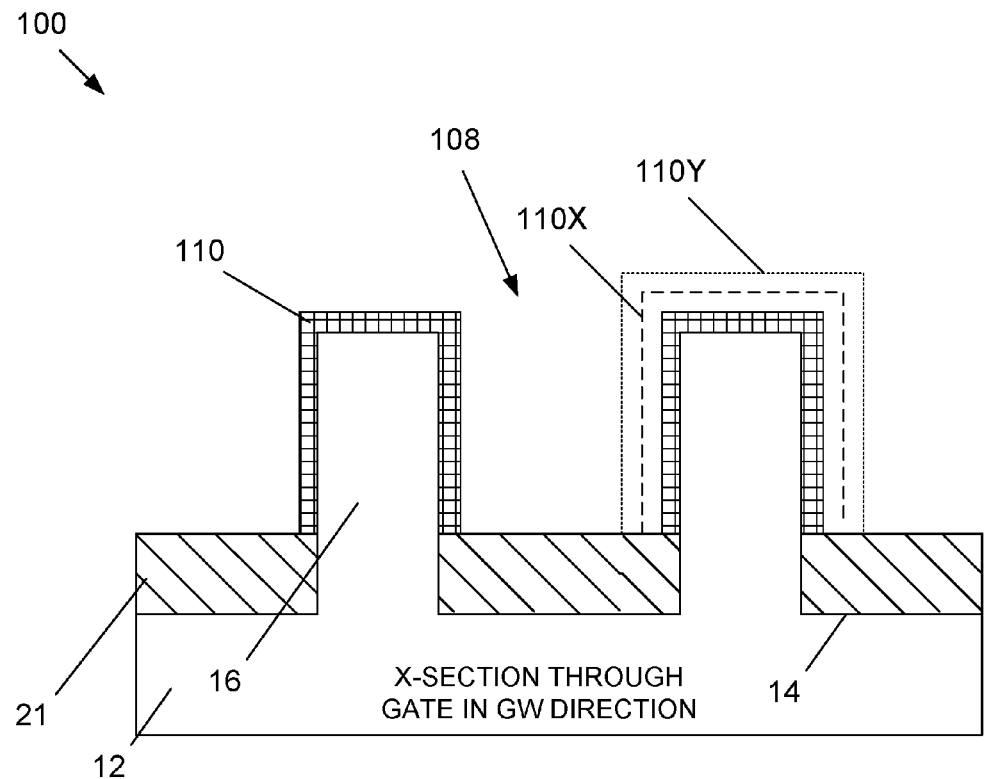
Figure 3E
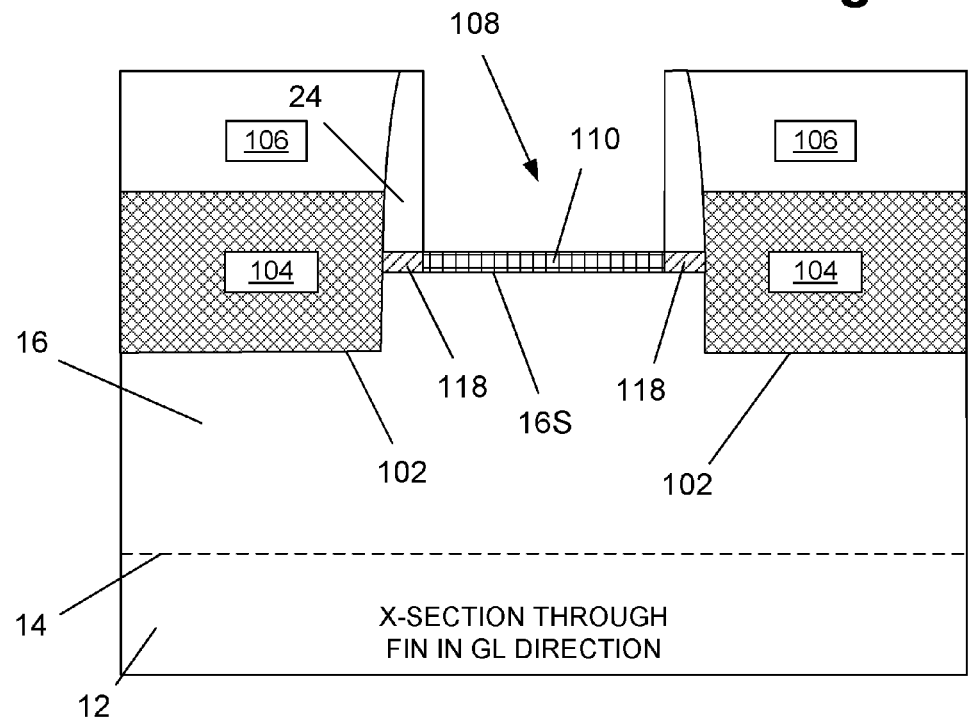

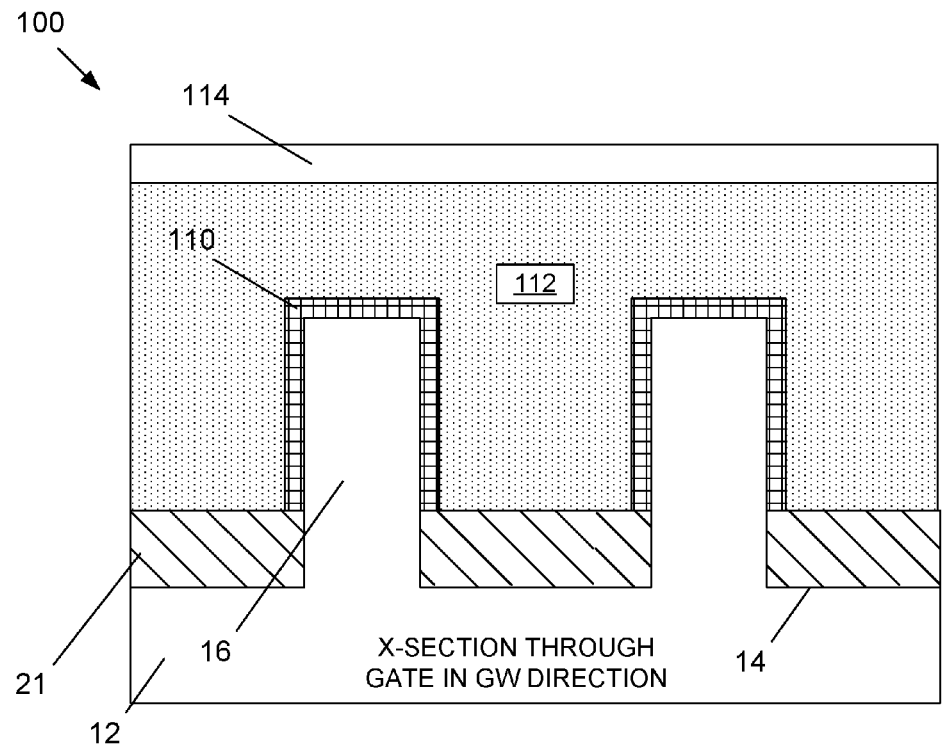
Figure 3F
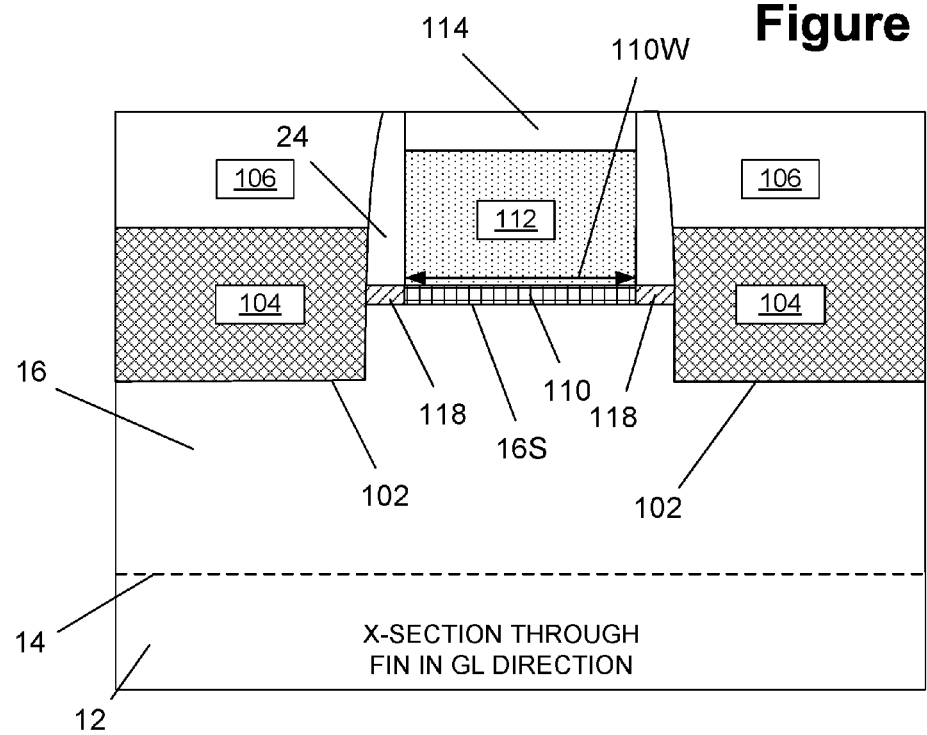

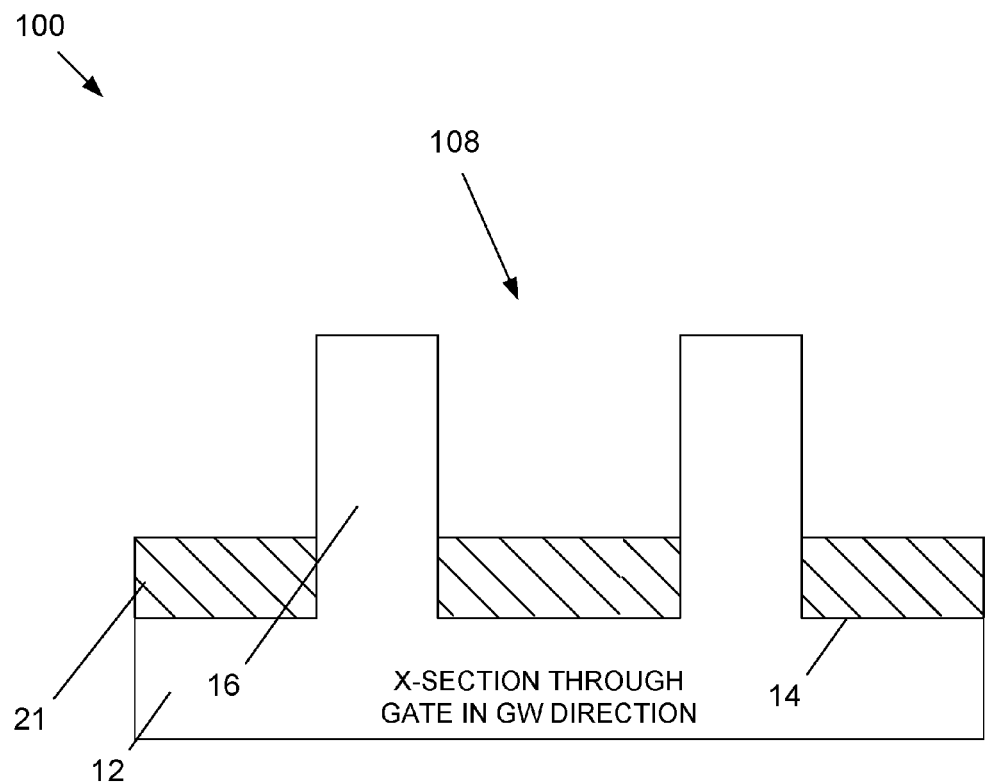
Figure 4D
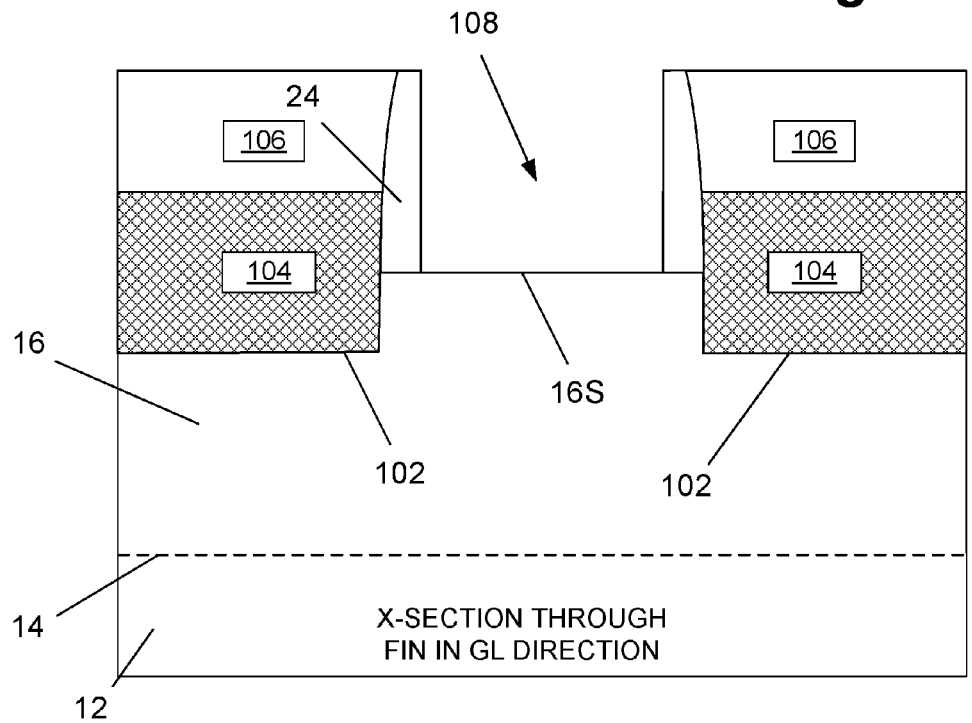

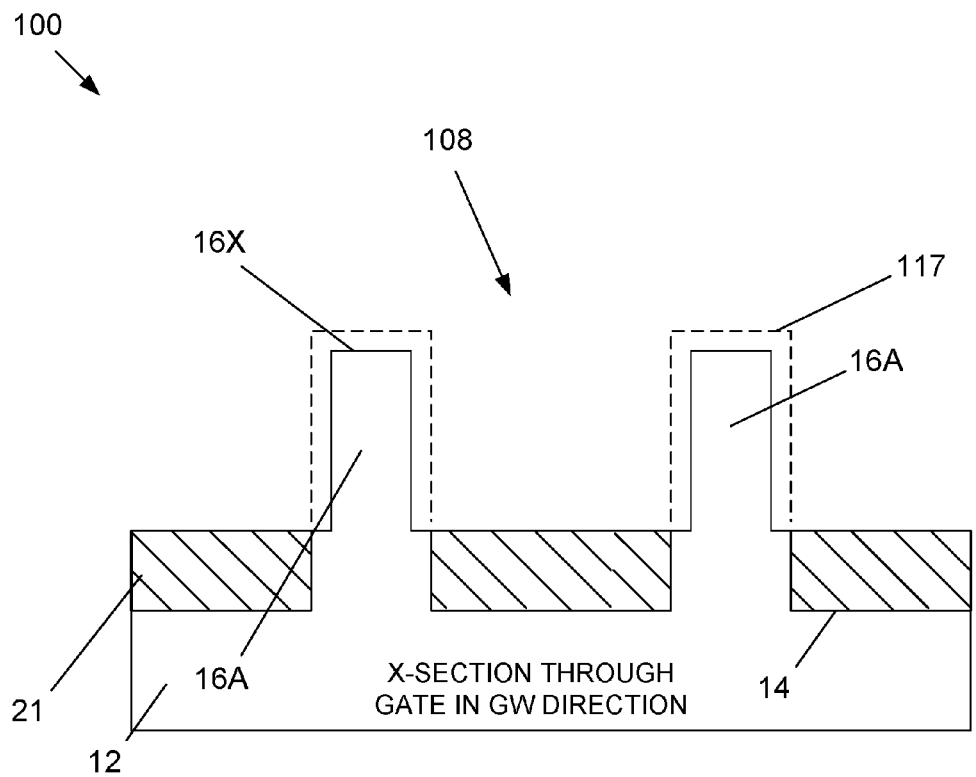
Figure 4E
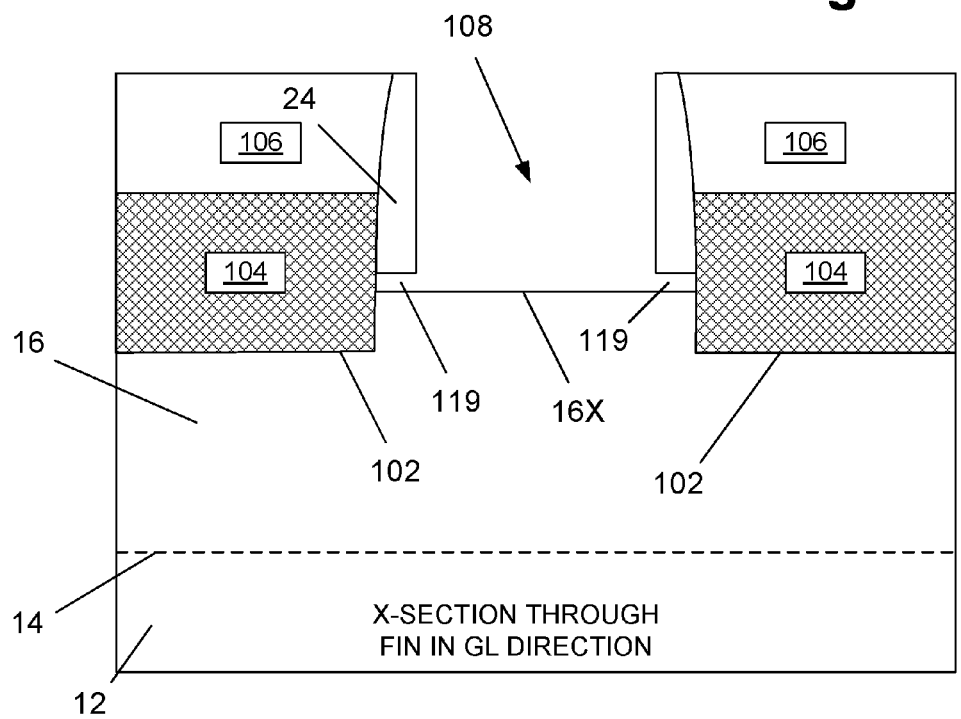

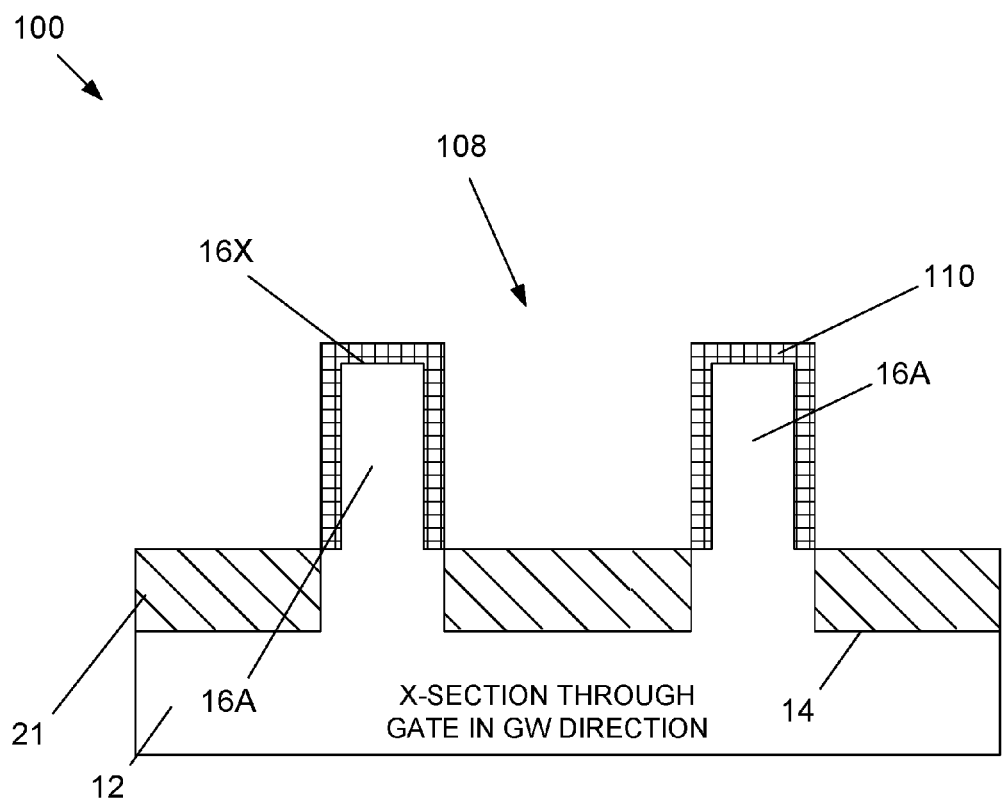
Figure 4F
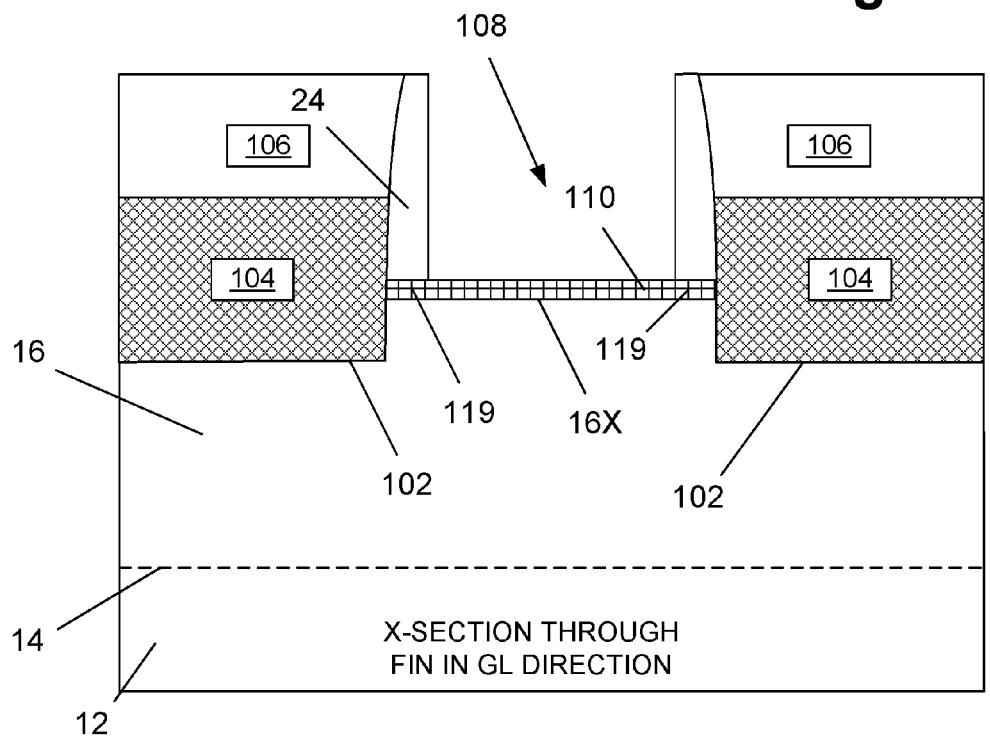

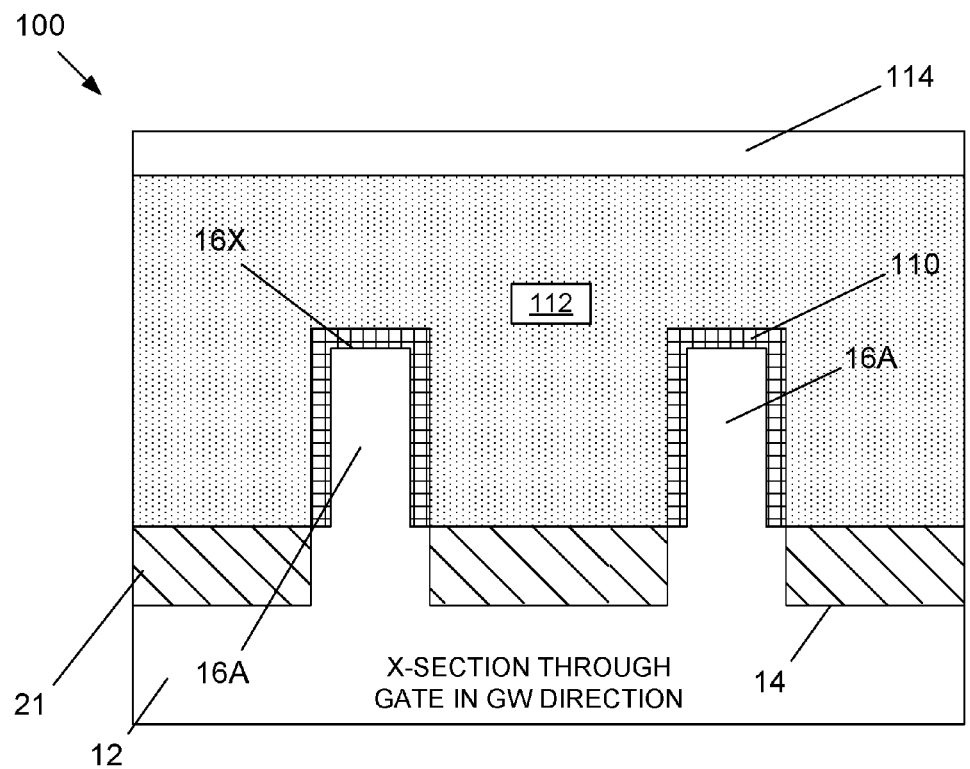
Figure 4G
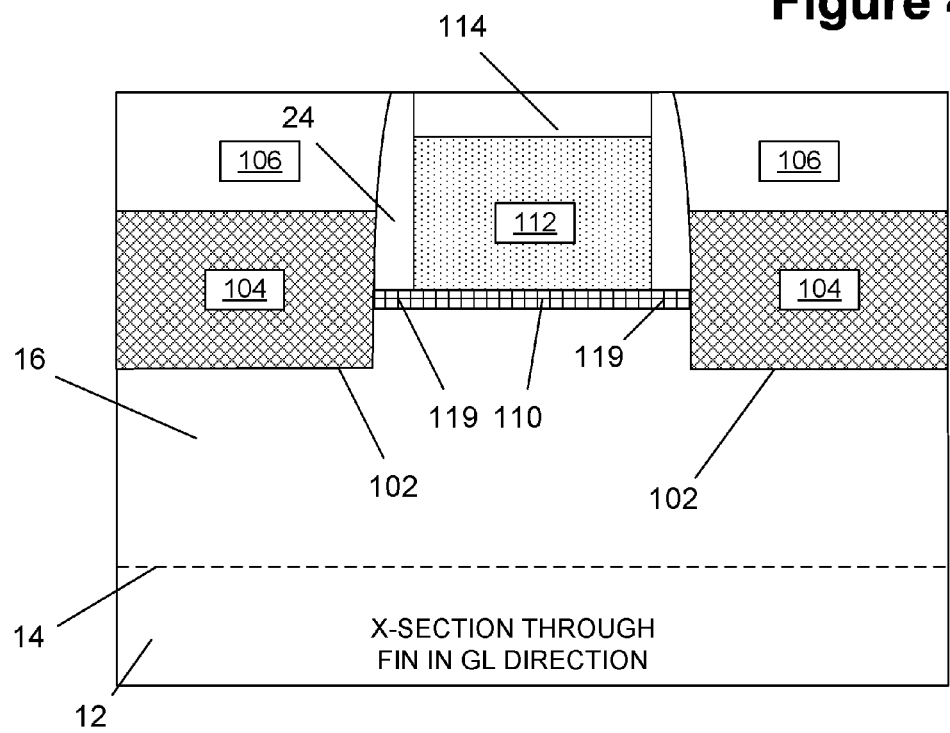

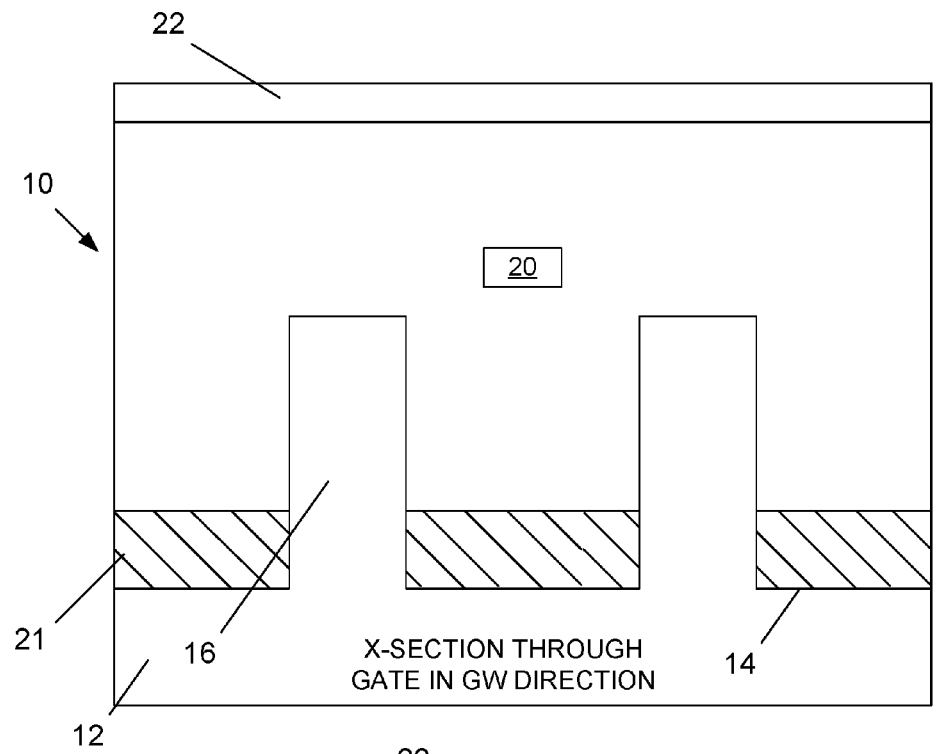
X-SECTION THROUGH GATE IN GW DIRECTION
Figure 5A
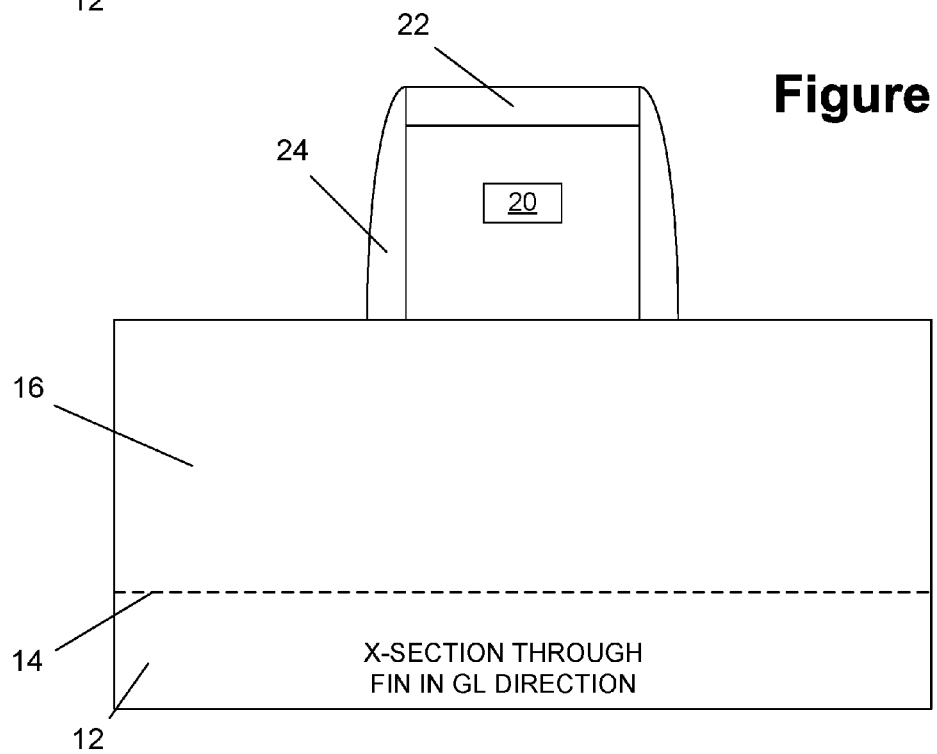
X-SECTION THROUGH FIN IN GL DIRECTION

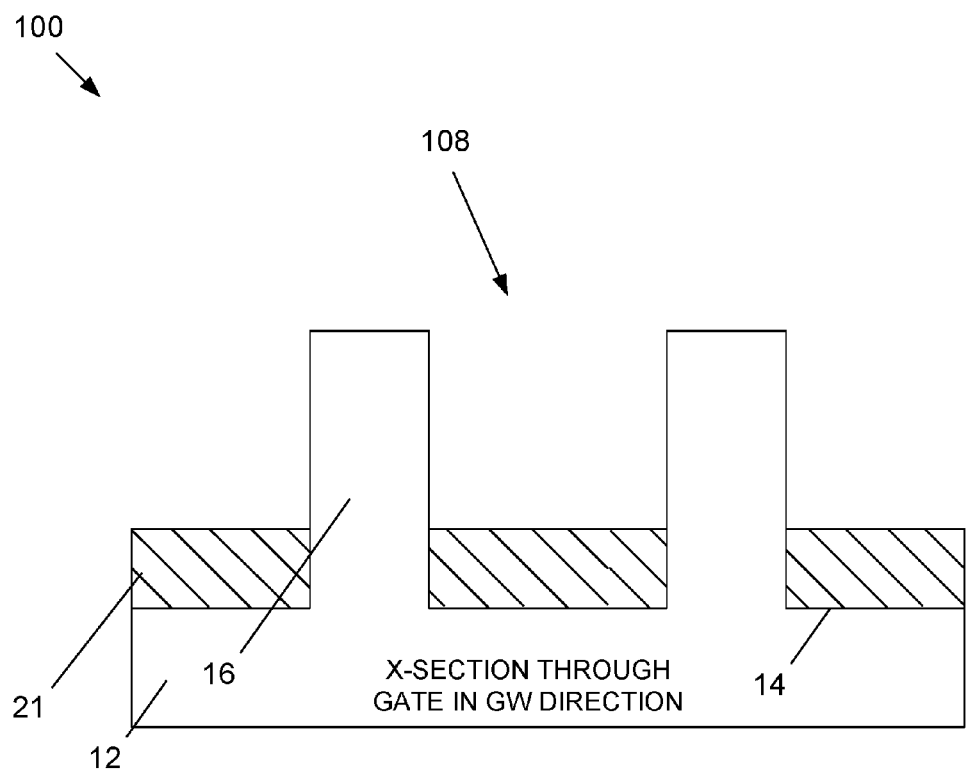
Figure 5D
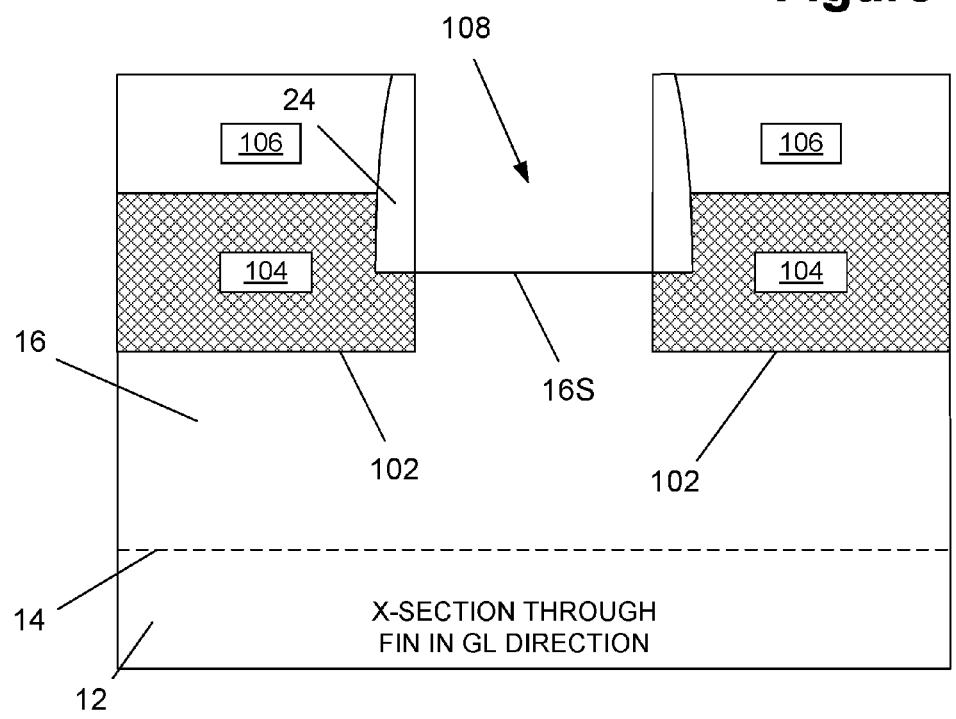

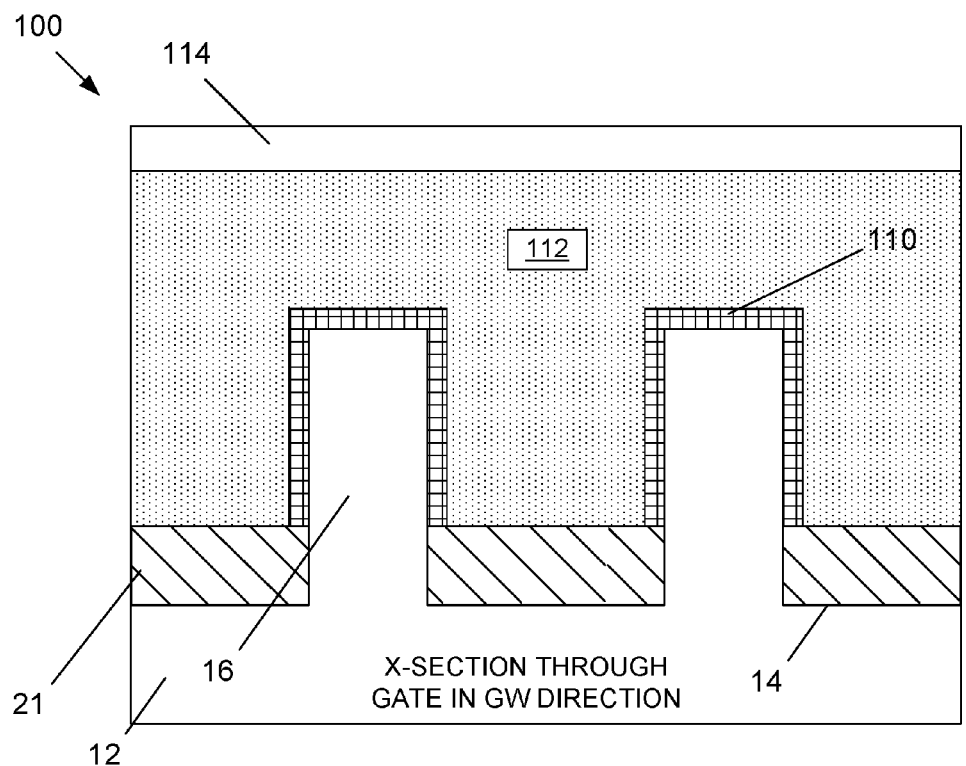
Figure 5E
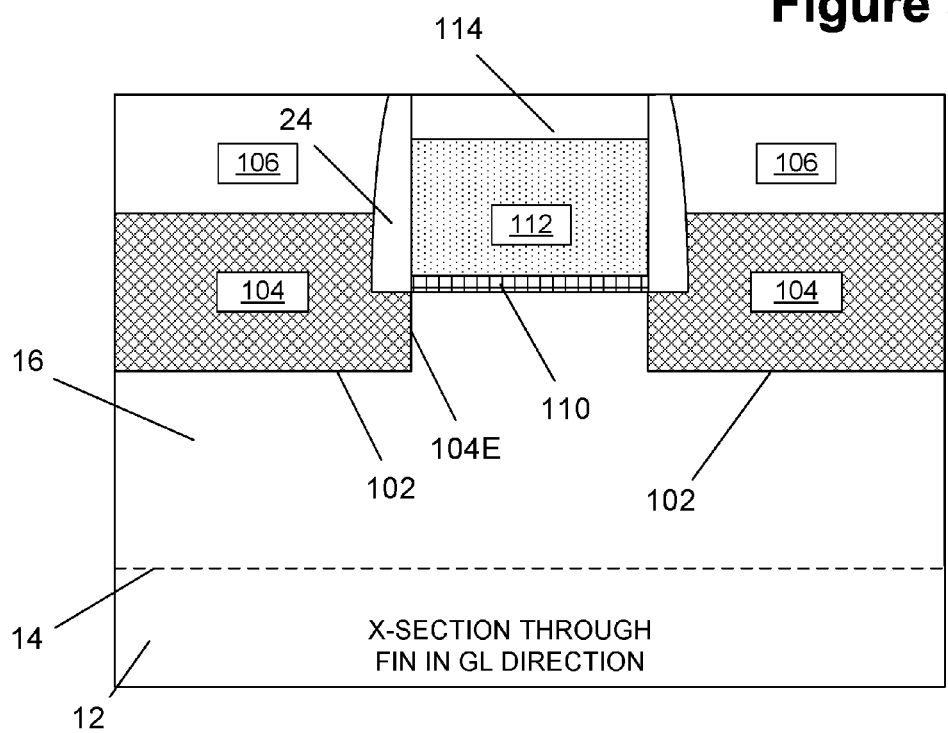

CHANNEL CLADDING LAST PROCESS FLOW FOR FORMING A CHANNEL REGION ON A FINFET DEVICE HAVING A REDUCED SIZE FIN IN THE CHANNEL REGION

BACKGROUND OF THE INVENTION

1. Field of the Invention

Generally, the present disclosure relates to the manufacture of FET semiconductor devices, and, more specifically, to various methods of forming epi semiconductor cladding materials in the channel region of a semiconductor device by performing various channel-cladding-last formation techniques, and the resulting semiconductor devices.

2. Description of the Related Art

The fabrication of advanced integrated circuits, such as CPU's, storage devices, ASIC's (application specific integrated circuits) and the like, requires the formation of a large number of so-called metal oxide field effect transistors (MOSFETs or FETs). A transistor includes a source region, a drain region, a channel region that is positioned between the source region and the drain region, and a gate electrode positioned above the channel region that is separated therefrom by a gate insulation layer. Current flow between the source and drain regions of the FET device is controlled by setting the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

Transistors come in a variety of configurations. A conventional FET is a planar device, wherein the transistor is formed in and above an active region having a substantially planar upper surface. In contrast to a planar FET, there are so-called 3D devices, such as an illustrative FinFET device, which is a three-dimensional structure. FIG. 1A is a perspective view of an illustrative prior art FinFET semiconductor device 10 that is formed above a semiconductor substrate 12 that will be referenced so as to explain, at a very high level, some basic features of a FinFET device. FIG. 1B is a cross-sectional view of the device 10 taken through the gate electrode 18 in the gate width (GW) direction of the device 10. As shown in FIG. 1A, in this example, the FinFET device 10 includes a plurality of trenches 14 formed in the substrate 12 that define three illustrative fins 16, a gate structure 18, sidewall spacers 20 and a gate cap layer 22. The fins 16 have a three-dimensional configuration: a height H, a width W and an axial length L. The axial length L of the fins 16 corresponds to the direction of current travel in the device 10 when it is operational. The portions of the fins 16 covered by the gate structure 18 are the channel regions of the FinFET device 10. With reference to FIG. 1B, the gate structure 18 is typically comprised of a layer of gate insulating material 18A, e.g., a layer of high-k insulating material (k-value of 10 or greater) or silicon dioxide, and one or more conductive material layers (e.g., metal and/or polysilicon) that serve as the gate electrode 18B for the device 10. In the device 10, the cladding material 17 is the primary current carrying portion of the channel region when the device 10 is operational, i.e., the gate length (GL) direction of the device. Typically, with respect to current day technology, the cladding material 17 may have a thickness 17T of about 2-3 nm. The cladding material 17 is typically an epi semiconductor material, such as silicon germanium, that is formed on the fin 16 by performing known epi deposition processes.

FIGS. 2A-2G depict an illustrative prior art process flow for a FinFET device with a cladded channel region. In FIGS. 2A-2G, the upper drawing is a cross-sectional view taken through the gate structure in the gate width direction (GW) of the device 10. The bottom drawing in FIGS. 2A-2G is a cross-sectional view taken through the middle of one of the fins 16 along the axial length of the fin 16, i.e., in a direction that is parallel to the gate length (GL) direction of the device 10.

FIG. 2A depicts the device 10 after several process operations were performed. First, a plurality of trenches 14 were formed in the substrate 12 to define the initial fins 16 (only two fins are shown in FIG. 2A). After the trenches 14 were formed, a layer of insulating material 21, such as silicon dioxide, was formed so as to overfill the trenches 14. Thereafter, a chemical mechanical polishing (CMP) process was performed to planarize the upper surface of the insulating material 21 with the top of the fins 16 (or the top of a patterned hard mask—not shown). Thereafter, a recess etching process was performed to recess the layer of insulating material 21 between adjacent fins 16 so as to thereby expose the upper portion of the fins 16.

FIG. 2B depicts the device 10 after an epitaxial deposition process was performed to form a cladding material 18 on the exposed portion of the fins 16. The cladding material 18 may be comprised of a variety of different materials, e.g., $Si_{(1-x)}Ge_{(x)}$, and it may be formed to any desired thickness.

FIG. 2C depicts the device 10 after several process operations were performed. First, an illustrative and schematically depicted sacrificial gate structure 20 and gate cap layer 22 (e.g., silicon nitride) were formed above the channel region of the device 10. Illustrative sidewall spacers 24 (e.g., silicon nitride) were formed adjacent the sacrificial gate structure 20. In one illustrative embodiment, the schematically depicted sacrificial gate structure 20 includes an illustrative gate insulation layer (not separately shown) and an illustrative gate electrode (not separately shown).

FIG. 2D depicts the device 10 in one illustrative process flow wherein trenches 23 were formed to remove portions of the fins 16 positioned in the source/drain regions of the device 10. Thereafter, an epi semiconductor material 25 was formed in the source/drain regions of the device 10 by performing a traditional epi growth process, i.e., raised source/drain regions were formed for the device 10. Various ion implant regions would have been formed in the fins 16/substrate 12 at this point in the process flow, e.g., halo implants, extension implants, well implants, etc. Thereafter, one or more heat treatment processes would have been performed to repair any damage to the crystalline structure of the fins 16 due to the various ion implantation processes and to activate the implanted dopant materials.

FIG. 2E depicts the device 10 after a layer of insulating material 26 was formed on the device 10 and after a CMP process was performed to planarize the upper surface of the layer of insulating material 26 with the upper surface of the gate cap layer 22.

FIG. 2F depicts the device 10 after several process operations were performed. First, one or more planarization processes, e.g., CMP processes, were performed to remove the gate cap layer 22 and a portion of the spacers 24 using the sacrificial gate structure 20 as a polish-stop layer. Thereafter, one or more etching processes were performed to remove the sacrificial gate structure 20 relative to the surrounding structures and thereby define a replacement gate cavity 28 where a replacement gate structure will eventually be formed for the device 10. Unfortunately, the cladding material 18 within the channel region of the device 10 is subjected to many of these process operations since it was formed prior to the formation of the sacrificial gate structure 20. As a result, the cladding material 18 within the channel region of the device 10 may be damaged or degraded. More specifically, the cladding material 18 within the channel region may have a variety of divots or defects 19 that may result in the removal of all or a portion of the thickness of the cladding material 18, as depicted in the dashed-line region 30. The amount and extent of damage to the cladding material 18 in the channel region of the device 10 may vary depending upon the device under construction and the exact process flow.

FIG. 2G depicts the prior art device 10 after an illustrative and schematically depicted replacement gate structure 32 and gate cap layer 34 were formed in the replacement gate cavity 28 of the device 10 using well-known techniques. In one illustrative embodiment, the schematically depicted replacement gate structure 32 includes an illustrative gate insulation layer (not separately shown) and an illustrative gate electrode (not separately shown). The gate insulation layer may be comprised of a variety of different materials, such as, for example, a so-called high-k (k value greater than 10) insulation material (where k is the relative dielectric constant), etc. Similarly, the gate electrode of the replacement gate structure 32 may be comprised of one or more metal layers that act as the gate electrode. Unfortunately, the damage to the cladding material 18 in the channel region of the device can adversely affect device performance.

The present disclosure is directed to various methods of forming one or more cladding materials in the channel region of a semiconductor device by performing various channel-cladding-last formation techniques, and the resulting semiconductor devices that may reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming one or more cladding materials in the channel region of a semiconductor device by performing various channel-cladding-last formation techniques, and the resulting semiconductor devices. One illustrative method disclosed herein includes, among other things, forming an initial fin in a semiconductor substrate, forming a sacrificial gate structure around a portion of the initial fin, forming a sidewall spacer adjacent opposite sides of the sacrificial gate structure and removing the sacrificial gate structure so as to thereby define a replacement gate cavity that is laterally defined by the sidewall spacers, wherein formation of the replacement gate cavity exposes a portion of the initial fin within the replacement gate cavity. In this example, the method further includes performing an etching process through the replacement gate cavity to remove portions of the initial fin so as to thereby define a reduced size fin and recesses under the sidewall spacers, forming at least one replacement epi semiconductor cladding material around the reduced size fin in the replacement gate cavity and in the recesses under the sidewall spacers, and forming a replacement gate structure within the replacement gate cavity around the at least one replacement epi semiconductor cladding material.

One illustrative device disclosed herein includes, among other things, a plurality of trenches that define a fin in a semiconducting substrate, the portion of the fin in the source/drain regions having a first height and a first width, a recessed layer of insulating material positioned in the trenches that exposes a portion of the fin, and a gate structure and sidewall spacers positioned on opposite sides of the gate structure, wherein the portion of the fin positioned under the gate structure and at least a portion of the sidewall spacers is a reduced size fin having a second height and a second width, the second height being less than the first height and the second width being less than the first width. In this embodiment, the device also includes epi source/drain regions positioned around portions of the fin positioned laterally outside the spacers and a channel epi semiconductor cladding material positioned around the reduced size fin, under the gate structure and at least partially under the sidewall spacers.

BRIEF DESCRIPTION OF THE DRAWINGS

The disclosure may be understood by reference to the following description taken in conjunction with the accompanying drawings, in which like reference numerals identify like elements, and in which:

FIGS. 2A-2G depict an illustrative prior art process flow for forming a cladded channel region on a FinFET device;

FIGS. 3A-3F depict various illustrative methods disclosed herein of forming cladding materials in the channel region of a semiconductor device, and the resulting semiconductor devices;

FIGS. 4A-4G depict other illustrative methods disclosed herein of forming cladding materials in the channel region of a semiconductor device, and the resulting semiconductor devices; and FIGS. 5A-5E depict yet other illustrative methods disclosed herein of forming cladding materials in the channel region of a semiconductor device, and the resulting semiconductor devices.

Figure 1A:
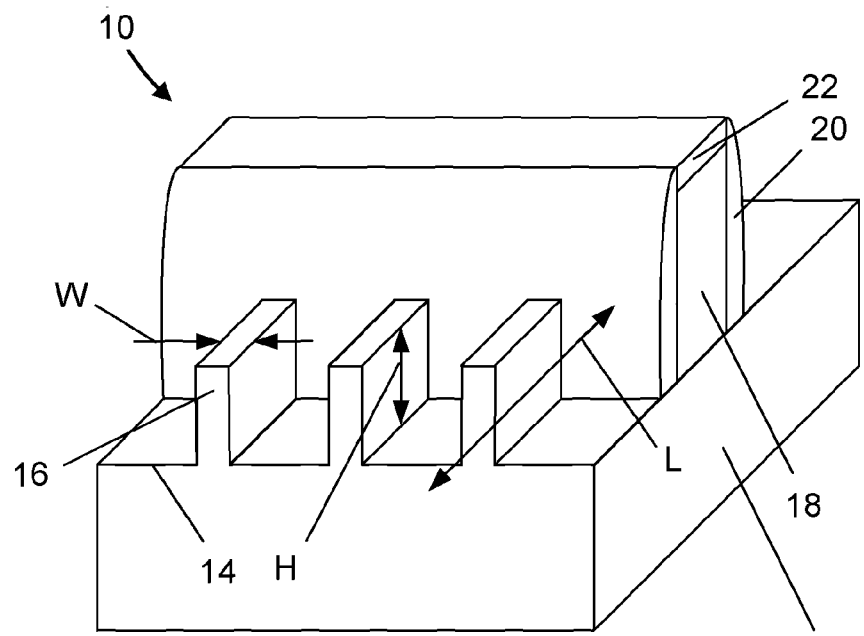
FIG. 1A is a perspective view of one illustrative embodiment of a prior art FinFET device.
Figure 1B:
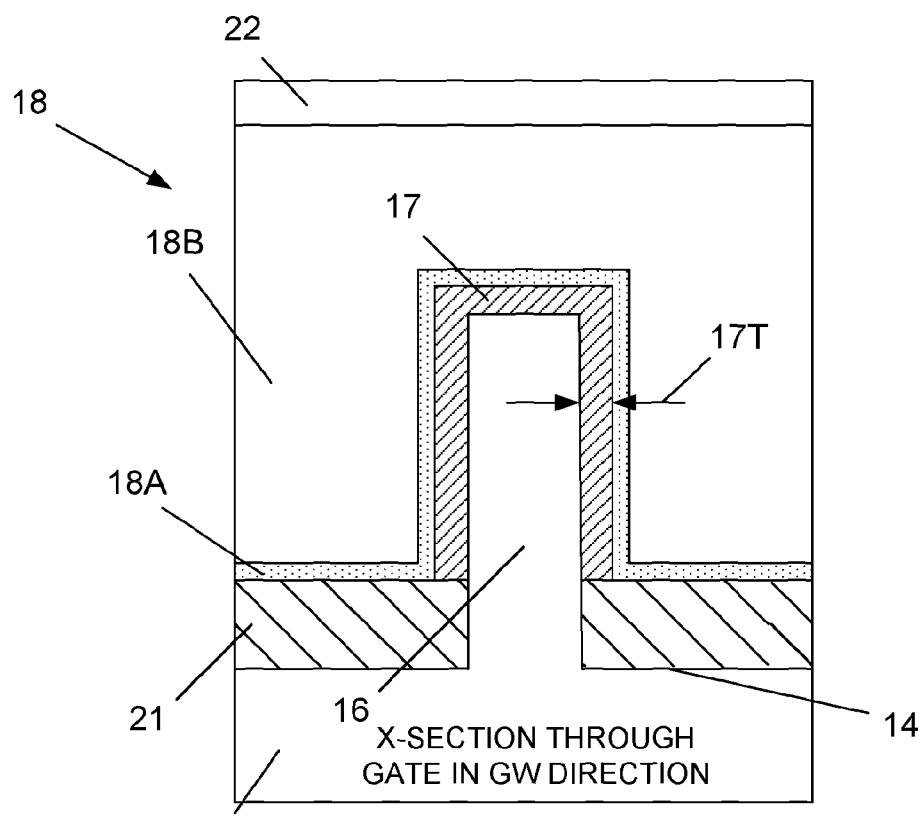
FIG. 1B is a cross-sectional view of an illustrative fin/gate structure of a prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a channel region for a semiconductor device by performing a triple cladding process, and the resulting semiconductor device. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

In one embodiment, the illustrative device 100 will be formed in and above the semiconductor substrate 12, having a bulk configuration. The device 100 may be either an NMOS or a PMOS transistor. In some instances, the reference numbers used for various components described in connection with FIG. 2A-2G above will be used to explain certain aspects of the presently disclosed invention. The substrate 12 may be made of silicon or it may be made of materials other than silicon. Thus, the terms "substrate" or "semiconductor substrate" should be understood to cover all semiconducting materials and all forms of such materials. Additionally, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the device 100 disclosed herein may be formed using a variety of different materials and by performing a variety of known techniques, e.g., a chemical vapor deposition (CVD) process, an atomic layer deposition (ALD) process, a thermal growth process, epi growth processes, spin-coating techniques, etc. The thicknesses of these various layers of material may also vary depending upon the particular application.

FIGS. 3A-3F depict one illustrative method disclosed herein of forming cladding materials in the channel region of a semiconductor device, and the resulting semiconductor devices.

Figure 2A:
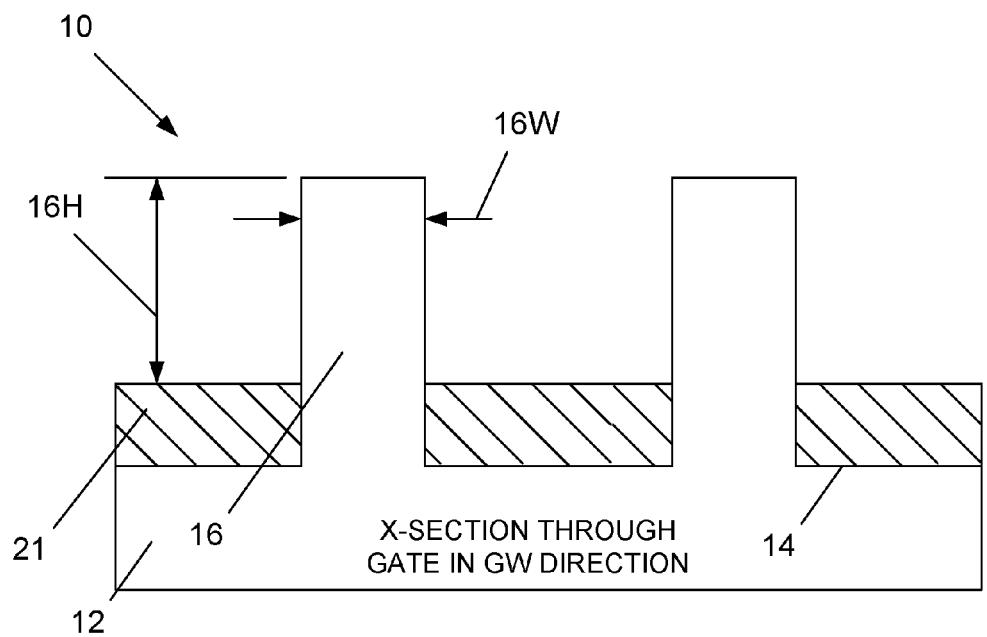
Figure 2A:
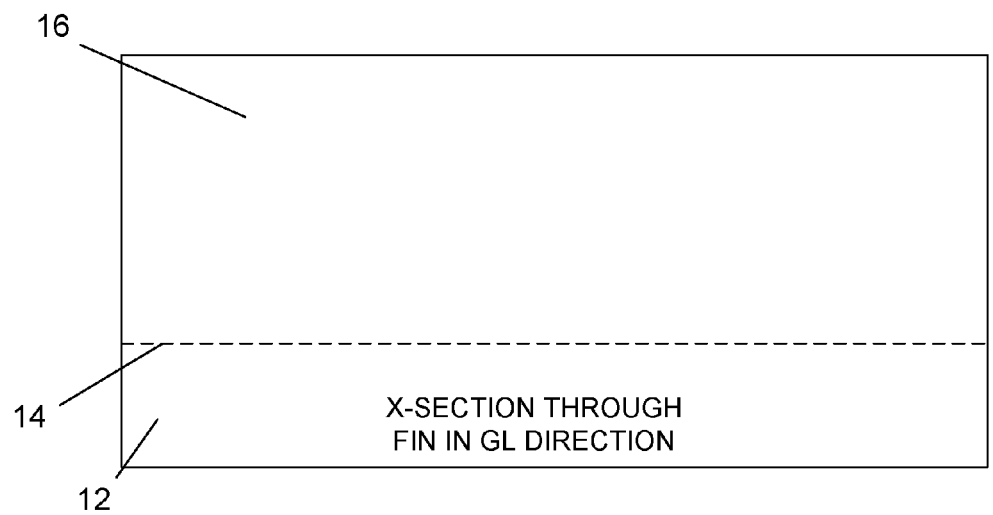
Figure 2B:
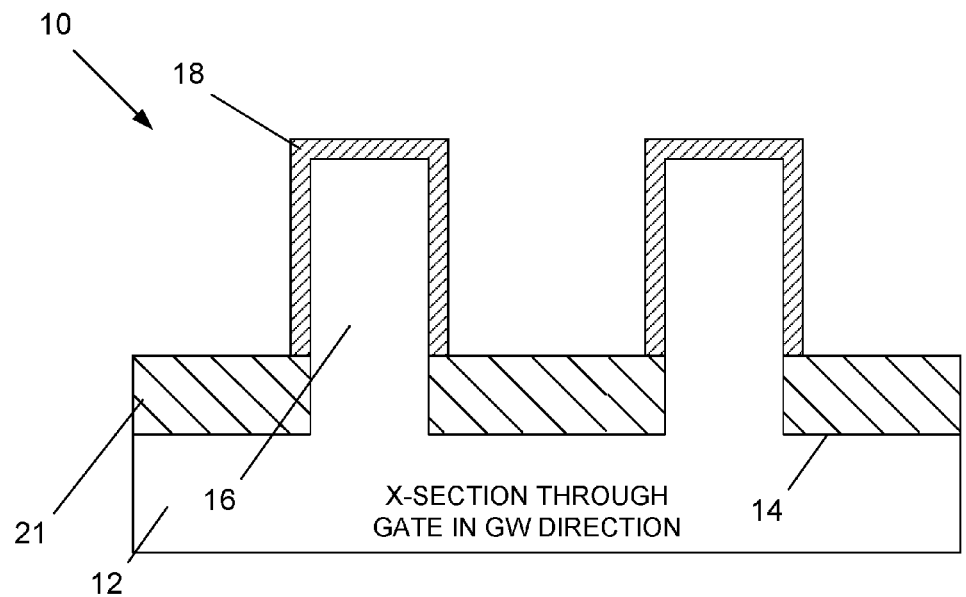
Figure 2B:
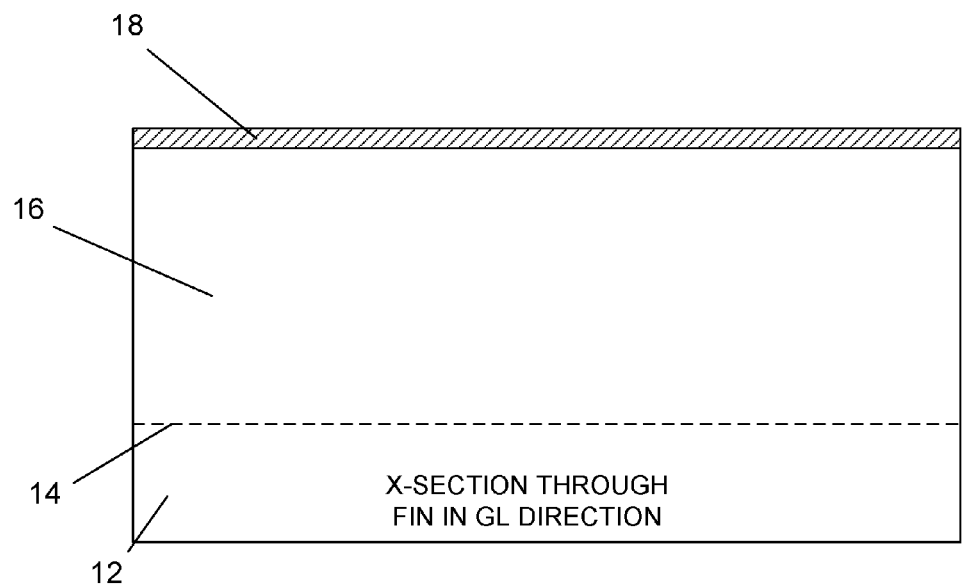
Figure 2C:
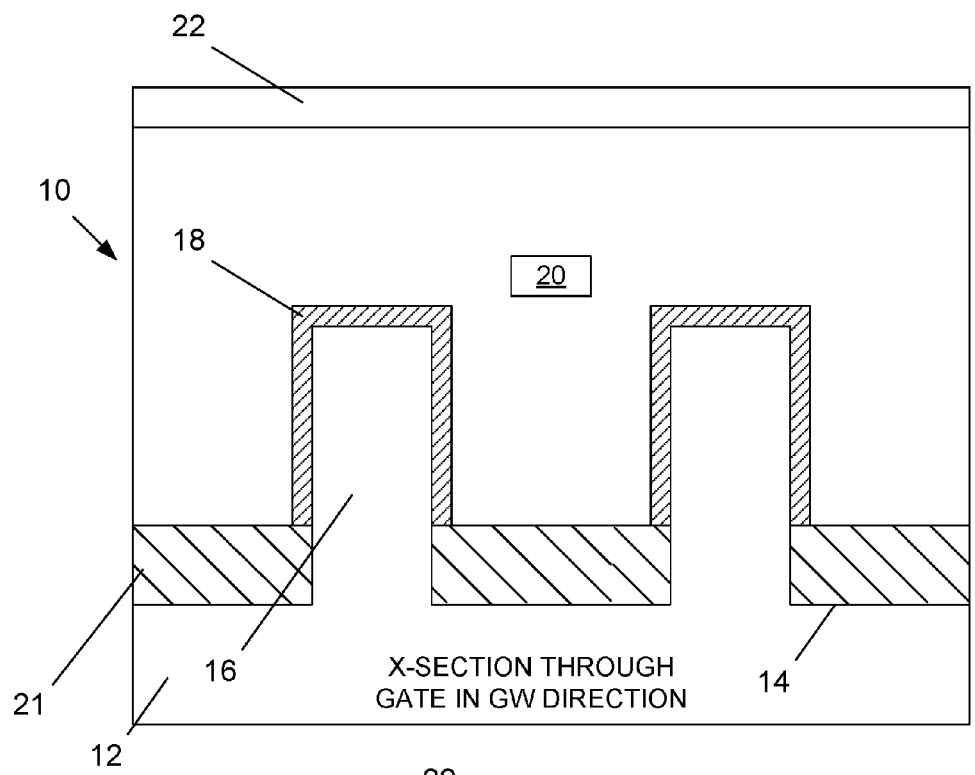
Figure 2C:
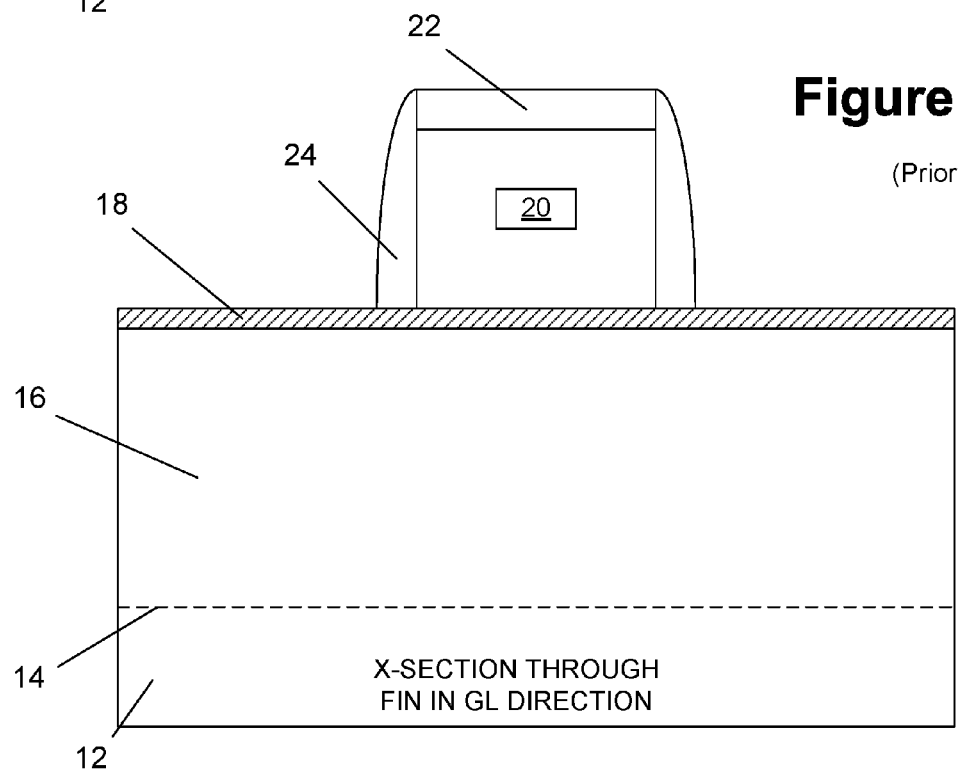
Figure 3A:
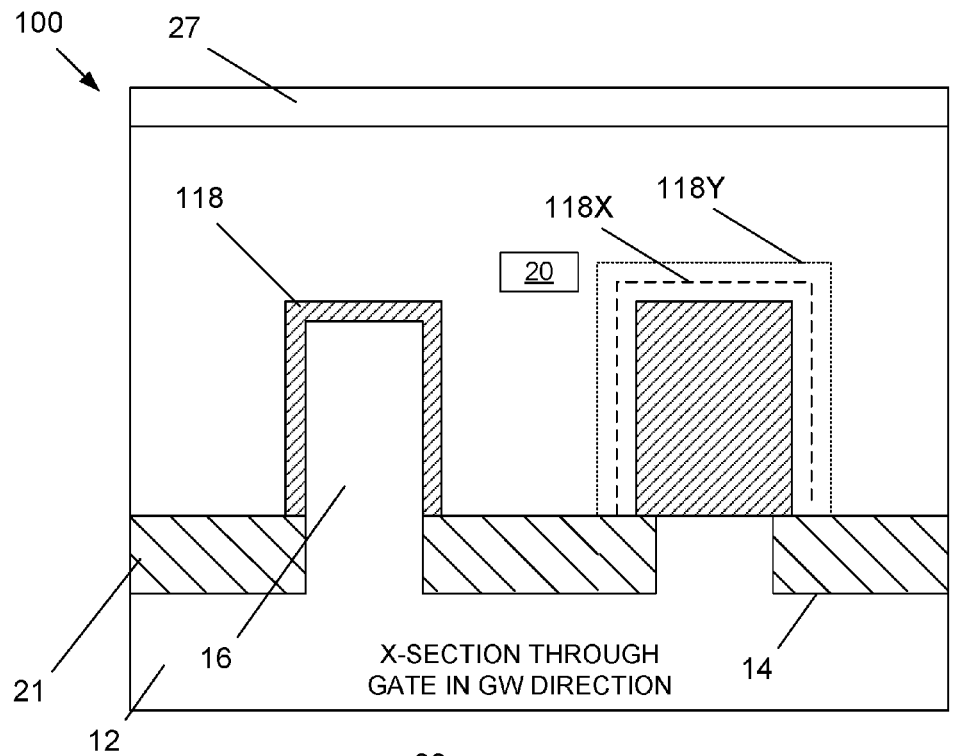
Figure 3A:
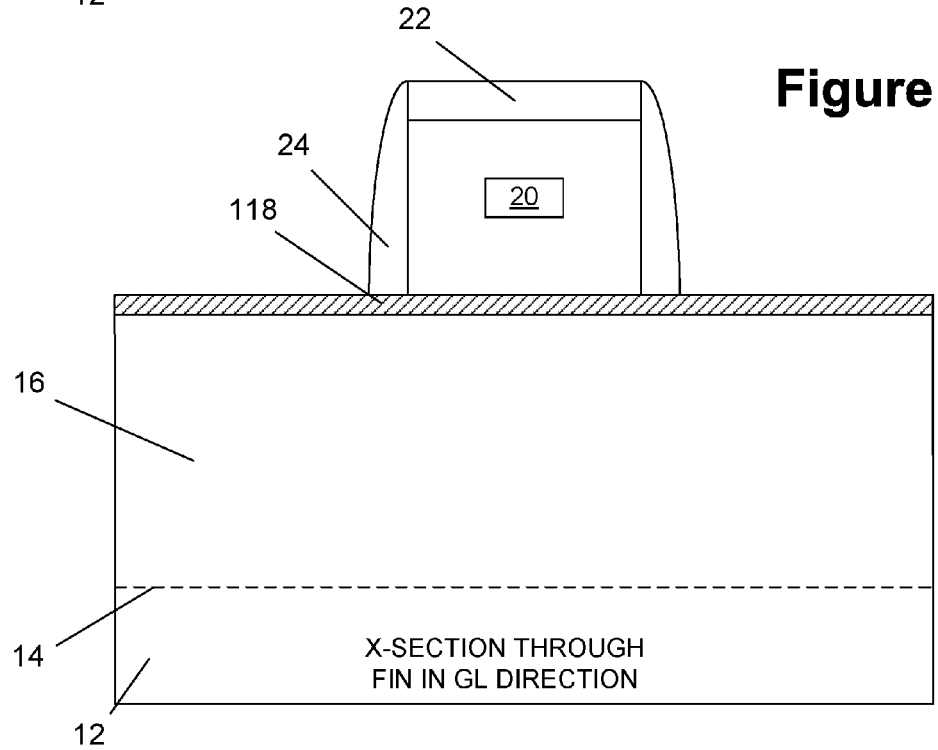

FIG. 3A depicts the device 100 at a point in fabrication that corresponds to that shown in FIG. 2C, i.e., after the formation of the fins 16, an initial cladding material 118 (that covers the entire axial length of the fins 16), the sacrificial gate structure 20, the gate cap layer 22 and the sidewall spacer 24. Of course, after a complete reading of the present application, those skilled in the art will appreciate that the initial cladding material 118 may be comprised or one or more layers of cladding material, as indicated by the dashed lines 118X, 118Y in the upper drawing of FIG. 3A (right fin only). The initial cladding material 118 may be comprised of a variety of different semiconductor materials, e.g., $Si_{(1-x)}Ge_{(x)}$ (where "x" ranges from 0.1-0.9), a III-V material, InGaAs, GaAs, InAs, GaSb, InSbAs, silicon, etc. The thickness of the initial cladding material 118 may vary depending upon the particular application, and it may be formed by performing a traditional epi growth process.

If desired, dopant materials may be added to the initial cladding material 118 by way of in situ doping or ion implantation. In one embodiment, for a PMOS device, the initial cladding material 118 may be doped with boron (e.g., $Si_{(1-x)}Ge_{(x)}$:B (where "x" ranges from 0.1-0.9). In the case of an NMOS device, the initial cladding material 118 may be doped with carbon (e.g., $Si_{(1-x)}Ge_{(x)}$:C (where "x" ranges from 0.1-0.9). The recessed layer of insulating material 21 may be comprised of a variety of different materials, such as silicon dioxide, etc., and it may be formed by performing a variety of techniques, e.g., chemical vapor deposition (CVD), etc. and thereafter recessing that layer of material to the desired height level within the trenches 14.

The overall size, shape and configuration of the fin-formation trenches 14 and fins 16 may vary depending on the particular application. In the illustrative examples depicted in the attached drawings, the fin-formation trenches 14 and fins 16 are all depicted as having a uniform size and shape. However, such uniformity in the size and shape of the fin-formation trenches 14 and the fins 16 is not required to practice at least some aspects of the inventions disclosed herein. In the attached figures, the fin-formation trenches 14 are depicted as having been formed by performing an anisotropic etching process that results in the fin-formation trenches 14 having a schematically depicted, generally rectangular configuration. In an actual real-world device, the sidewalls of the fin-formation trenches 14 may be somewhat inwardly tapered, although that configuration is not depicted in the attached drawings. Thus, the size and configuration of the fin-formation trenches 14, and the manner in which they are made, as well as the general configuration of the fins 16, should not be considered a limitation of the present invention. For ease of disclosure, only the substantially rectangular fin-formation trenches 14 and fins 16 will be depicted in the subsequent drawings. Moreover, the device 100 may be formed with any desired number of fins 16.

Figure 3B:
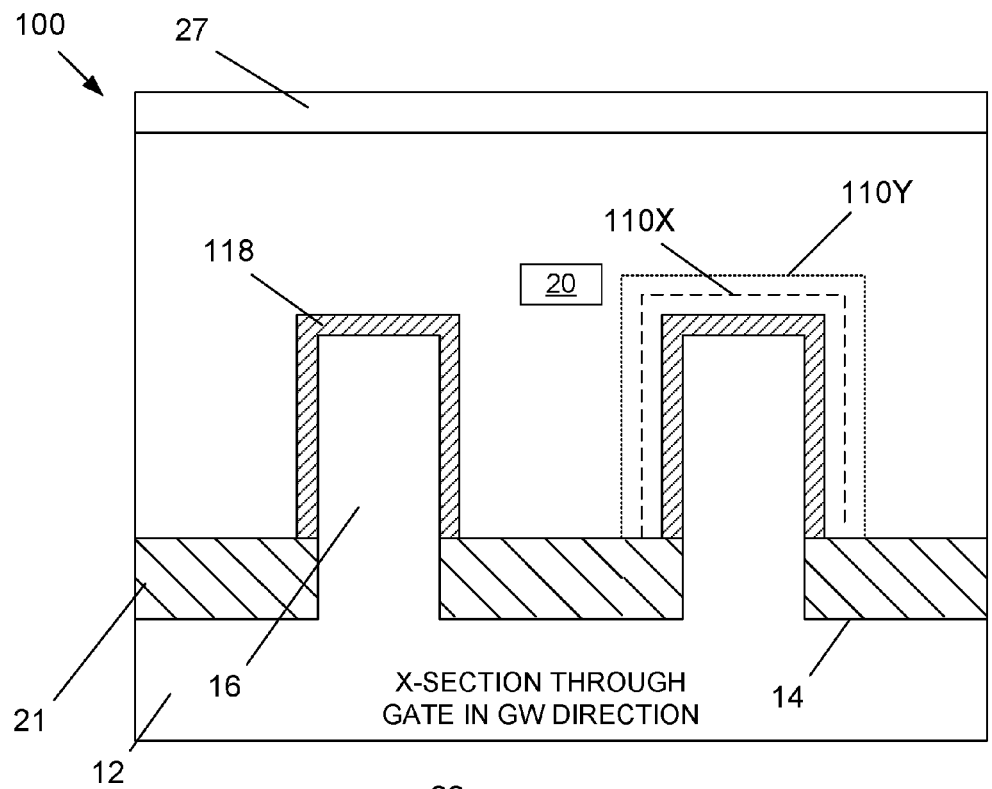
Figure 3B:
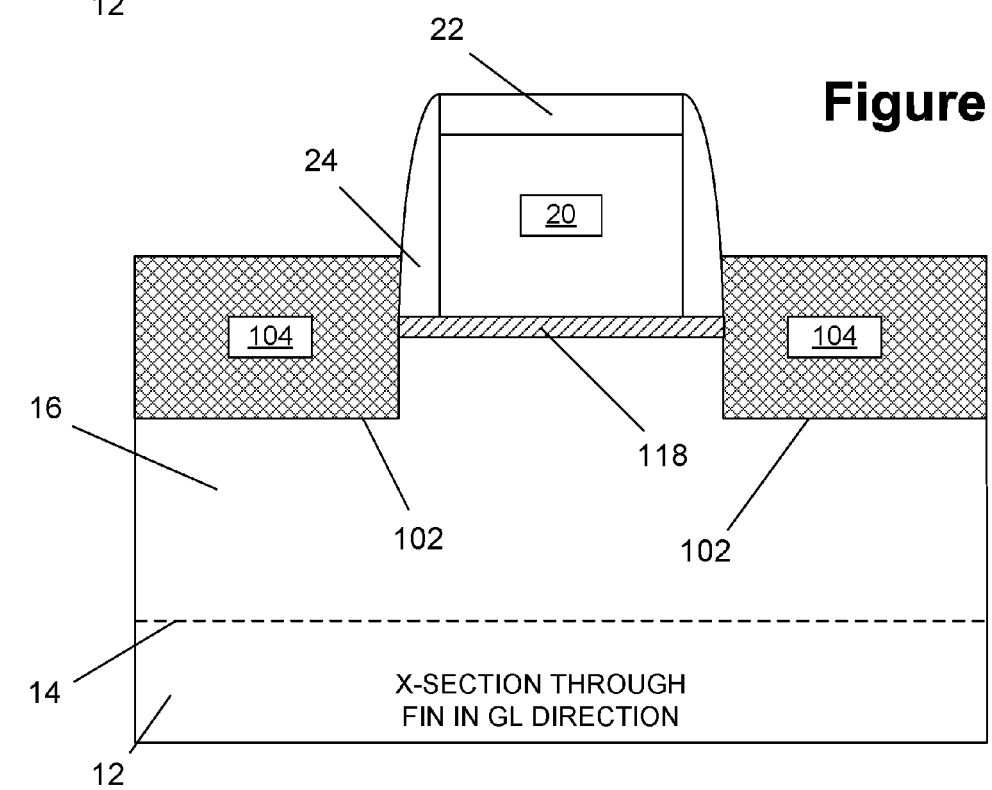

FIG. 3B depicts the device 100 in accordance with one illustrative process flow wherein trenches 102 were formed in the source/drain regions to remove portions of the fins 16 positioned in the source/drain regions of the device 100, i.e., laterally outside of the spacers 24. Thereafter, an epi semiconductor material 104 was formed in the trenches 102 in the source/drain regions of the device 100 by performing a traditional epi growth process, i.e., so-called embedded source/drain regions were formed for the device 100. In another illustrative process flow, the trenches 102 may not be formed and the epi material 104 may simply be grown on the portions of the fins 16 in the source/drain regions of the device so as to form so-called raised source/drain regions for the device 100. In another embodiment, the formation of the trenches 102 may be omitted and the epi material 104 may simply be formed on the initial cladding material 118 in the source/drain regions of the device 100 so as to form raised source/drain regions for the device 100. At least all of the foregoing alternatives for the formation of source/drain regions should be considered to fall within the scope of the attached claims. For purposes of disclosure only, the subsequent drawing will depict the formation of the trenches 102 and the embedded source/drain regions 104. Various ion implant regions would have been formed in the fins 16/substrate 12 at this point in the process flow, e.g., halo implants, extension implants, well implants, etc. At this point in the process flow, one or more heat treatment processes would have been performed to repair any damage to the crystalline structure of the fins 16 due to the various ion implantation processes and to activate the implanted dopant materials.

FIG. 3C depicts the device 100 after several process operations were performed. First, a layer of insulating material 106 was formed on the device 100 above the epi semiconductor material 104. Thereafter, one or more CMP processes were performed to planarize the upper surface of the layer of insulating material 106 with the upper surface of the sacrificial gate structure 20. Then, one or more etching processes were performed to remove the sacrificial gate structure 20 relative to the surrounding structures and thereby define a replacement gate cavity 108 where a replacement gate structure will eventually be formed for the device 100. As in the prior art method disclosed in the background section of this application, the initial cladding material 118 within the channel region/gate cavity 108 of the device 100 was exposed to one or more of the various process operations that were performed after the initial cladding material 118 was formed. The defects 19 (e.g., see FIG. 2F) that would normally be present in the initial cladding material 118 within the gate cavity 108 at this point in the process flow are not depicted in FIG. 3C.

FIG. 3D depicts the device 100 after an etching process, such as an anisotropic etching process, was performed through the gate cavity 108 to remove portions of the initial cladding material 118. This etching process is performed selectively relative to the material of the fin 16 and the surrounding structures. This etching process exposes an upper surface 16S of the fin 16 within the gate cavity 108. In one embodiment, the remaining portions of the initial cladding material 118 are substantially self-aligned with respect to the inner surfaces of the spacers 24 that laterally define the gate cavity 108. In other embodiments, there may be some slight recessing of the initial cladding material 118 under the sidewall spacers 24, but that situation is not depicted in FIG. 3D.

FIG. 3E depicts the device 100 after a replacement channel cladding material 110 was formed on the portions of the fin 16 exposed within the gate cavity 108. Of course, after a complete reading of the present application, those skilled in the art will appreciate that the depicted replacement channel cladding material 110 may be comprised of one or more layers of cladding material, as indicated by the dashed lines 110X, 110Y in the upper drawing of FIG. 3E (right fin only). The replacement channel cladding material 110 may be comprised of a variety of different materials, e.g., $Si_{(1-x)}Ge_{(x)}$ (where "x" ranges from 0.1-0.9), a III-V material, InGaAs, GaAs, InAs, GaSb, InSbAs, silicon, etc. The replacement channel cladding material 110 may be comprised of the same material or a different material than that of the initial cladding material 118. The thickness of the replacement channel cladding material 110 may vary depending upon the particular application, it may be thicker or thinner than the initial cladding material 118, and it may be formed by performing one or more traditional epi growth processes. If desired, dopant materials, e.g., carbon, boron, etc., may be added to the replacement channel cladding material 110 by way of in situ doping or ion implantation.

FIG. 3F depicts the device 100 after an illustrative and schematically depicted replacement gate structure 112 and gate cap layer 114 were formed in the replacement gate cavity 108 of the device 100 above the replacement channel cladding material 110 using well-known techniques. In one illustrative embodiment, the schematically depicted replacement gate structure 112 includes an illustrative gate insulation layer (not separately shown) and an illustrative gate electrode (not separately shown). The gate insulation layer may be comprised of a variety of different materials, such as, for example, a so-called high-k (k value greater than 10) insulation material (where k is the relative dielectric constant), etc. Similarly, the gate electrode of the replacement gate structure 112 may be comprised of one or more metal layers that act as the gate electrode. As will be recognized by those skilled in the art after a complete reading of the present application, the gate structure 112 of the device 100 depicted in the drawings, i.e., the gate insulation layer and the gate electrode, is intended to be representative in nature. That is, the gate structure 112 may be comprised of a variety of different materials and it may have a variety of configurations. In one embodiment, the remaining portions of the initial cladding material 118 and the replacement cladding layer 110 may serve as the primary channel regions of the device 100, where substantially all of the current will flow during operation of the device 100, while the portions of the fins 16 (around which the layers 118/110 are positioned) will act as a core region wherein little if any of the current will flow when the device 100 is in operation. Note that, using the methods disclosed herein, the replacement channel cladding material 110 has a width 110 W (in the gate length direction of the device 100) that corresponds approximately to the width of the gate cavity 108 and the final replacement gate structure 112. That is, in this embodiment, the replacement channel cladding material 110 was formed such that it is substantially self-aligned with respect to the gate cavity 108 and the sidewalls of the replacement gate structure 112.

At the point of fabrication depicted in FIG. 3F, traditional manufacturing techniques may be performed to complete the manufacture of the device 100. For example, additional contacts and metallization layers may be formed above the device 100 using traditional techniques.

FIGS. 4A-4G depict another illustrative method disclosed herein of forming cladding materials in the channel region of a semiconductor device, and the resulting semiconductor devices. In this embodiment, the initial cladding material 118 will not be formed on the fins 16 prior to the formation of the sacrificial gate structure 20. Rather, in this embodiment, a cladding material will only be formed in the channel region of the device 100 through the replacement gate cavity.

Figure 4A:
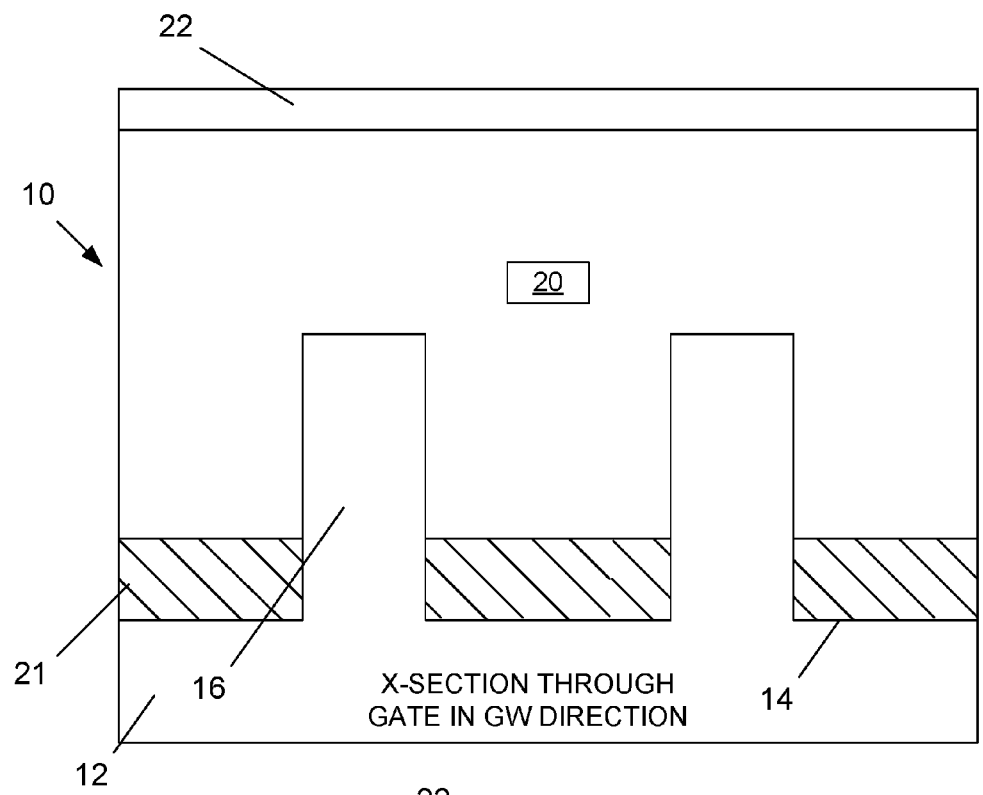
Figure 4A:
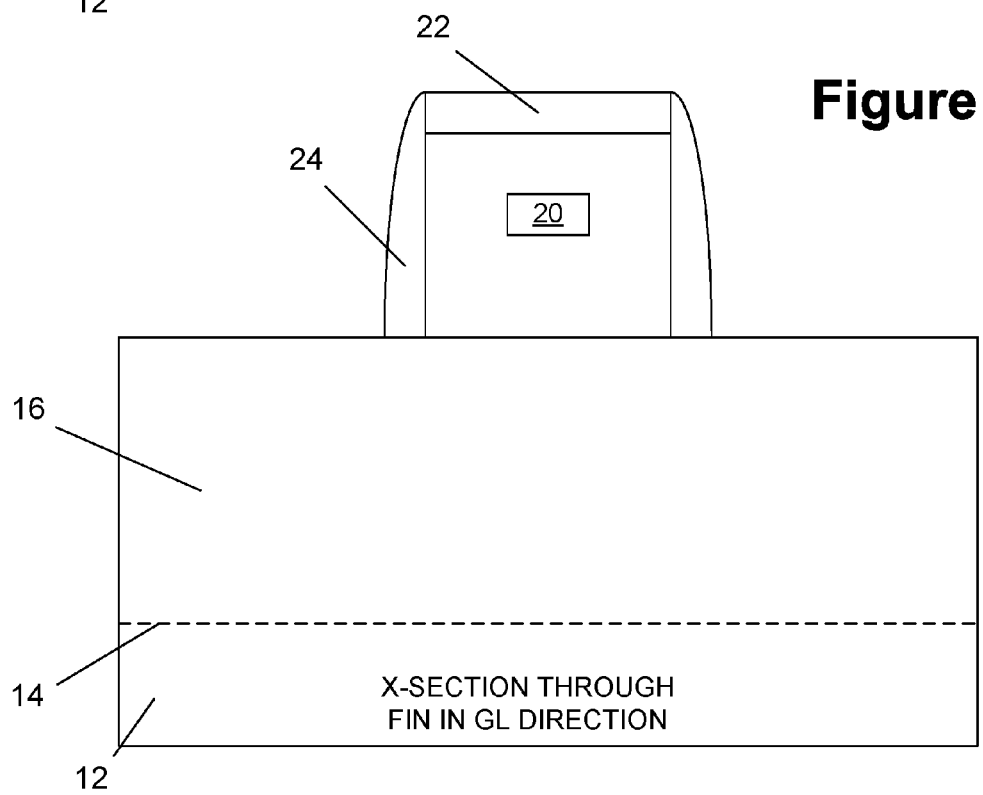

FIG. 4A depicts the device 100 at a point in fabrication that corresponds to that shown in FIG. 3A with the initial cladding material 118 omitted, i.e., after the formation of the fins 16, the sacrificial gate structure 20, the gate cap layer 22 and the sidewall spacer 24.

Figure 4B:
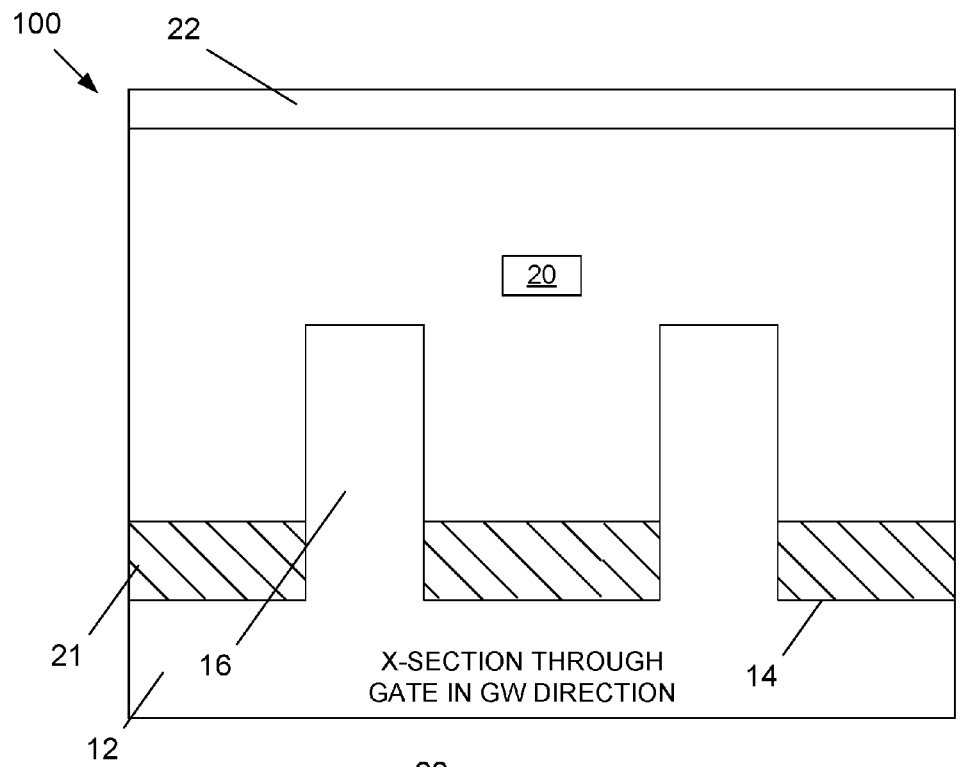
Figure 4B:
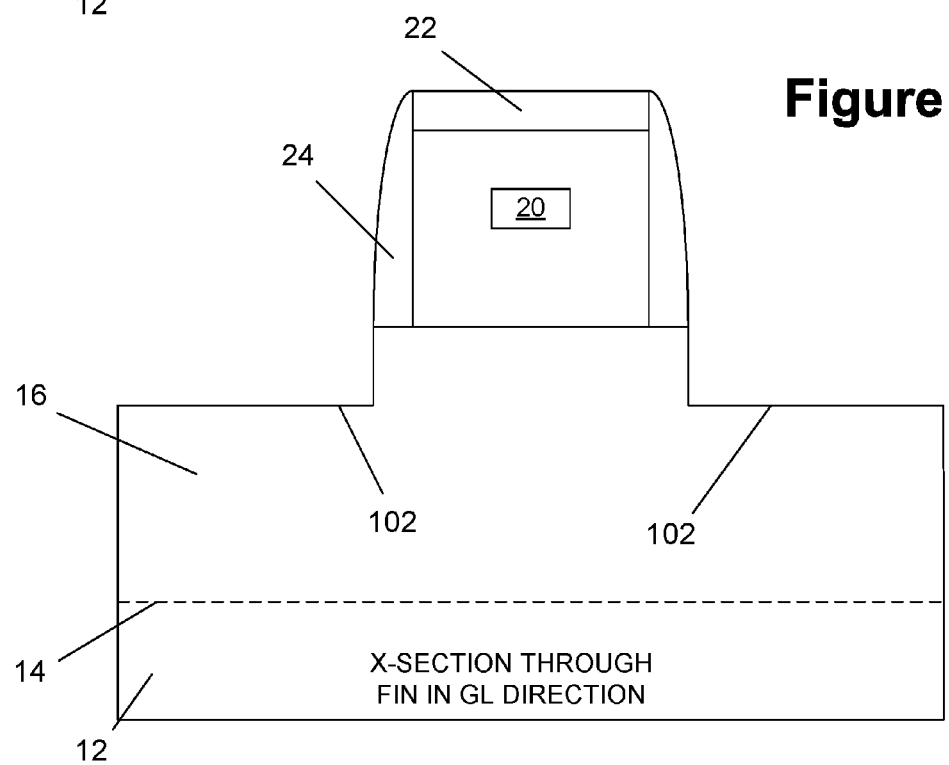

FIG. 4B depicts the device 100 in the illustrative example wherein trenches 102 were formed in the source/drain regions to remove portions of the fins 16 positioned in the source/drain regions of the device 100. In this embodiment, an anisotropic etching process was performed to form the trenches 102. Thus the trenches 102 are substantially self-aligned relative to the sidewall spacers 24. In one embodiment, the formation of the trenches 102 may be omitted and the epi material 104 (FIG. 4C) may simply be formed on the fins in the source/drain regions of the device 100 so as to form raised source/drain regions, as discussed above with reference to FIG. 3B.

Figure 4C:
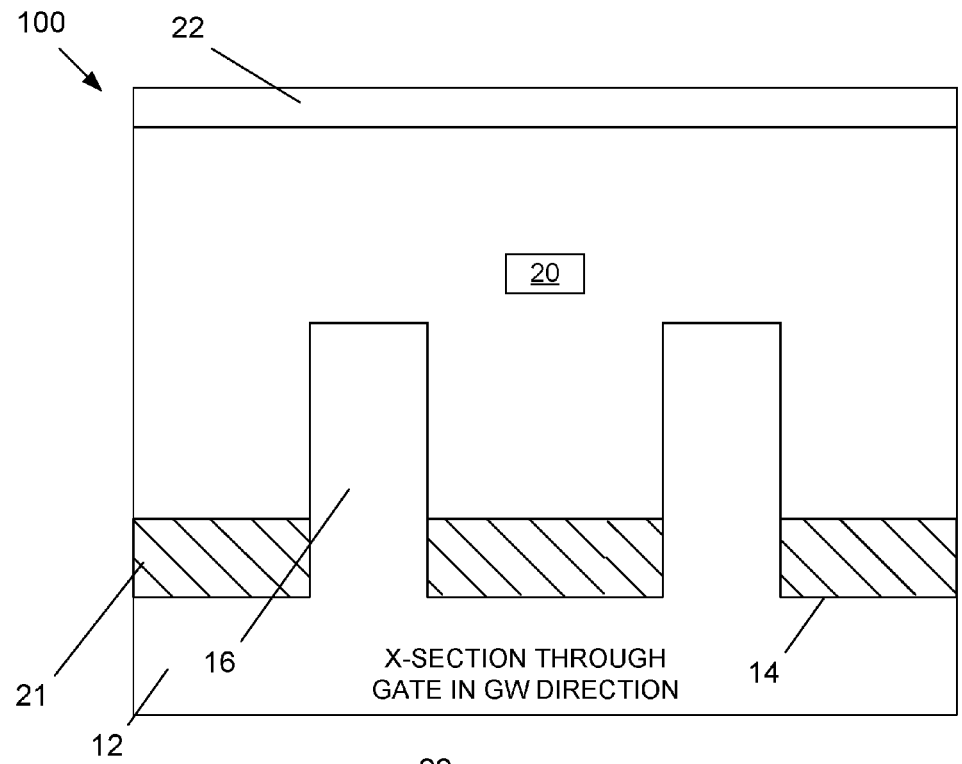
Figure 4C:
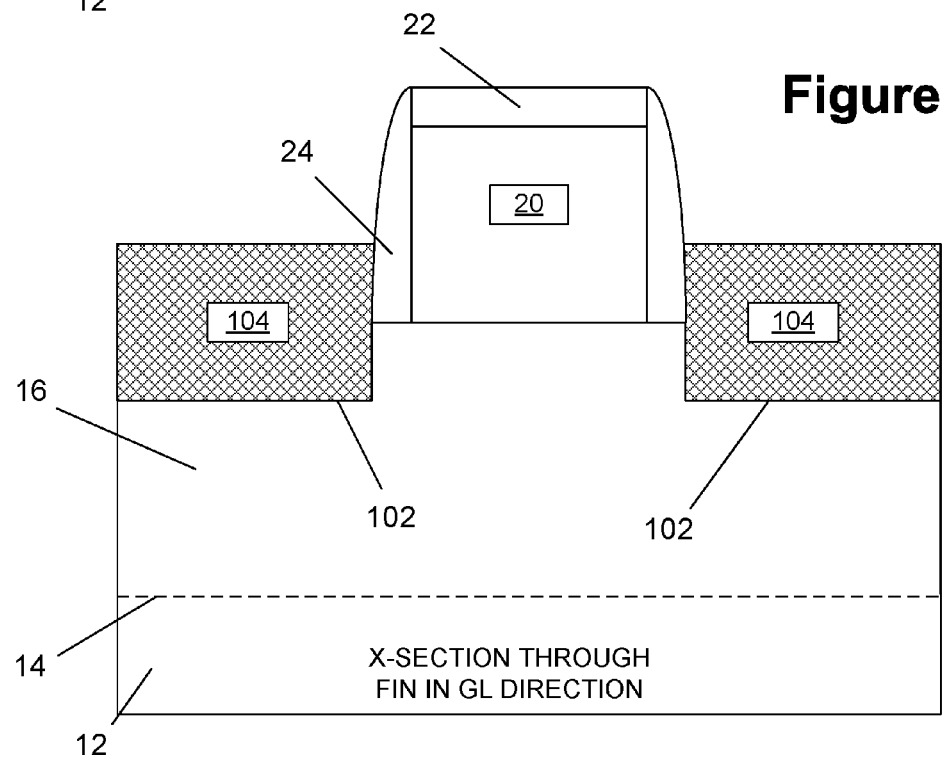

FIG. 4C depicts the device 100 after the above-described epi semiconductor material 104 was formed in the source/drain regions of the device 100 by performing a traditional epi growth process, i.e., embedded source/drain regions were formed for the device 100. As before, various ion implant regions would have been formed in the fins 16/substrate 12 at this point in the process flow, e.g., halo implants, extension implants, well implants, etc.

FIG. 4D depicts the device 100 after several process operations were performed. First, the above-described layer of insulating material 106 was formed on the device 100 above the epi semiconductor material 104. Thereafter, one or more CMP processes were performed to planarize the upper surface of the layer of insulating material 106 with the upper surface of the sacrificial gate structure 20. Then, one or more etching processes were performed to remove the sacrificial gate structure 20 relative to the surrounding structures and thereby define the replacement gate cavity 108. The removal of the sacrificial gate structure 20 exposes the upper surface 16S of the fin 16 within the gate cavity 108.

FIG. 4E depicts the device 100 after an etching process, such as an isotropic etching or pre-clean process, was performed through the gate cavity 108 to remove portions of the upper and sidewall surfaces of the fin structure 16 in the area of the channel region of the device 100. The outline of the fin structure 16 before this etching process was performed is depicted by the dashed lines 117 shown in the upper drawing in FIG. 4E. The reduced size fins (above the layer of insulating material 24) are identified with the reference numbers 16A in FIG. 4E. Importantly, this etching process removes sufficient fin material so as to define recesses 119 under the spacers 24 and a new (and lower) upper surface 16X for the fin 16 under the gate cavity 108. In one embodiment, the recesses 119 are full width recesses that extend all of the way under the lateral width of spacers 24 to the epi semiconductor material 104. The amount of material removed in the etching process, e.g., the thickness (in the vertical direction) of the recesses 119 may vary depending upon the particular application. In one embodiment, the reduced size fin 16A has a width and a height that is less than a width and a height, respectively, of the initial fin 16.

FIG. 4F depicts the device 100 after the above-described replacement channel cladding material 110 was formed on the portions of the fin 16A exposed within the gate cavity 108 and in the recesses 119.

FIG. 4G depicts the device 100 after the above-described replacement gate structure 112 and gate cap layer 114 were formed in the replacement gate cavity 108 of the device 100 above the replacement channel cladding material 110 using well-known techniques. At the point of fabrication depicted in FIG. 4G, traditional manufacturing techniques may be performed to complete the manufacture of the device 100.

FIGS. 5A-5E depict yet another illustrative method disclosed herein of forming cladding materials in the channel region of a semiconductor device, and the resulting semiconductor devices. In this embodiment, the initial cladding material 118 will not be formed on the fins 16 prior to the formation of the sacrificial gate structure 20. Rather, in this embodiment, a cladding material will only be formed in the channel region of the device 100 through the replacement gate cavity.

FIG. 5A depicts the device 100 at a point in fabrication that corresponds to that shown in FIG. 4A, i.e., after the formation of the fins 16, the sacrificial gate structure 20, the gate cap layer 22 and the sidewall spacer 24.

Figure 5B:
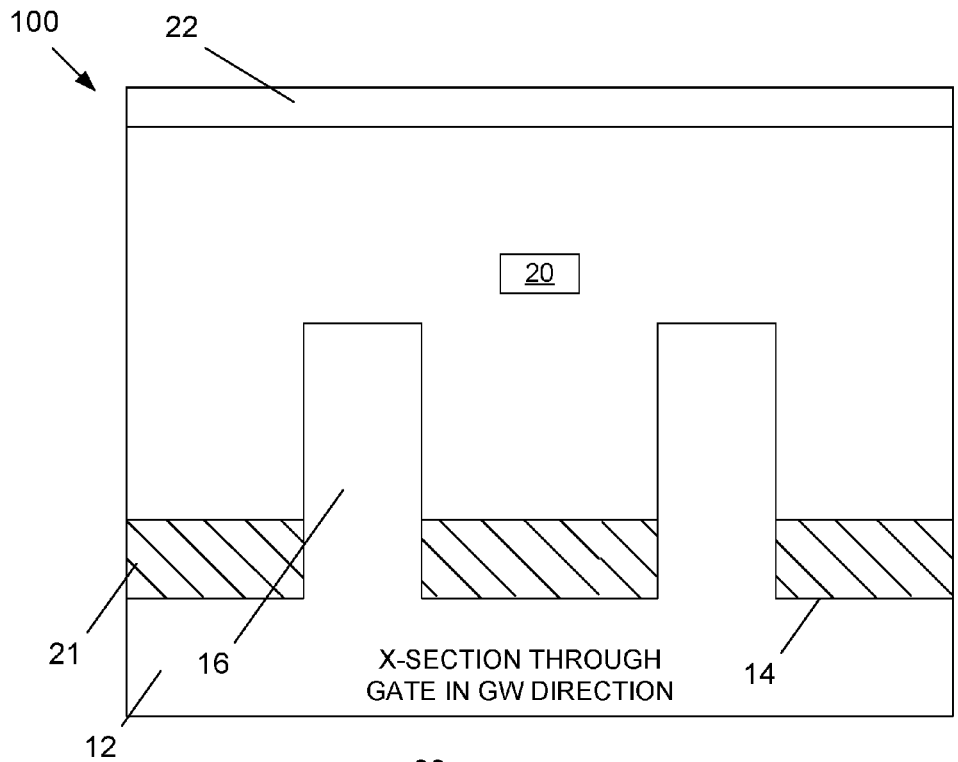
Figure 5B:
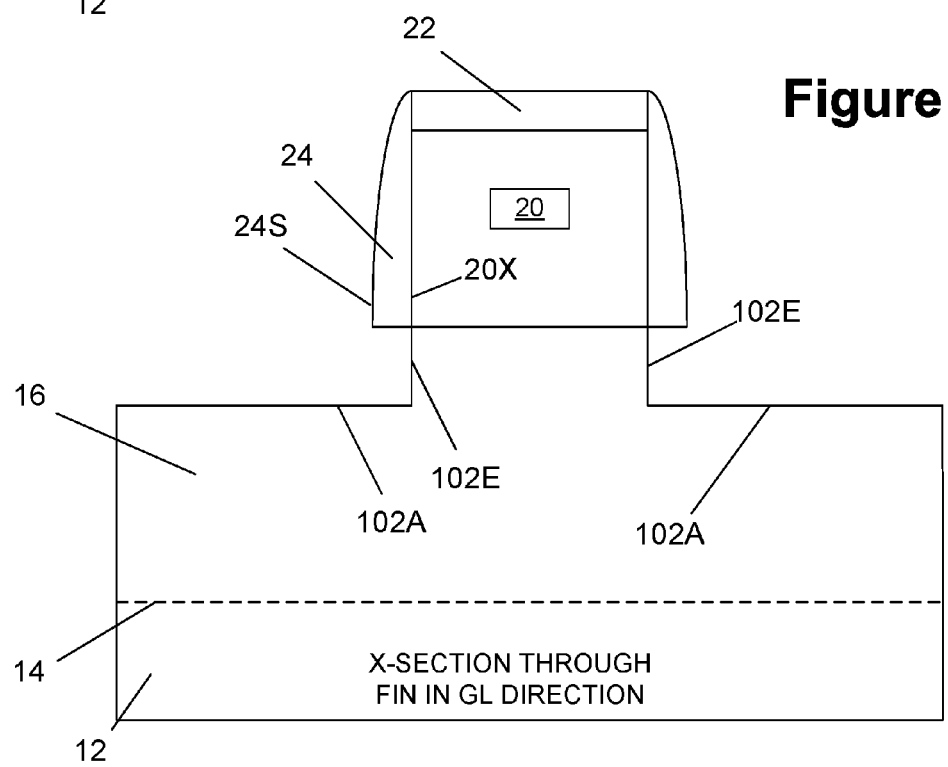

FIG. 5B depicts the device 100 after trenches 102A were formed in the source drain regions to remove portions of the fins 16 positioned in the source/drain regions of the device 100. In this embodiment, at least some portion of the etching processes used to form the trenches 102A is isotropic in nature such that the inward edges 102E of the trenches 102A extend laterally inward of an outer surface 24S of the spacers 24. In one embodiment, the inward edges 102E of the trenches 102A will extend laterally under substantially the entire width of the spacers 24 such that the inward edges 102E are located adjacent the channel region of the device 100, the inward edges 102E of the trenches 102A are positioned at a location that is even with or inward (toward the channel region) of a vertical line corresponding to an outermost edge 20X of the sidewall of the sacrificial gate structure 20. In the embodiment shown in FIG. 5B, the inward edge 102E of the trench 102A is substantially vertically aligned with the sidewall of the sacrificial gate structure 20. In some cases, the trenches 102A may be formed entirely by performing an isotropic etching process. In other cases, the trenches 102A may be formed by performing a combination of anisotropic and isotropic etching processes.

Figure 5C:
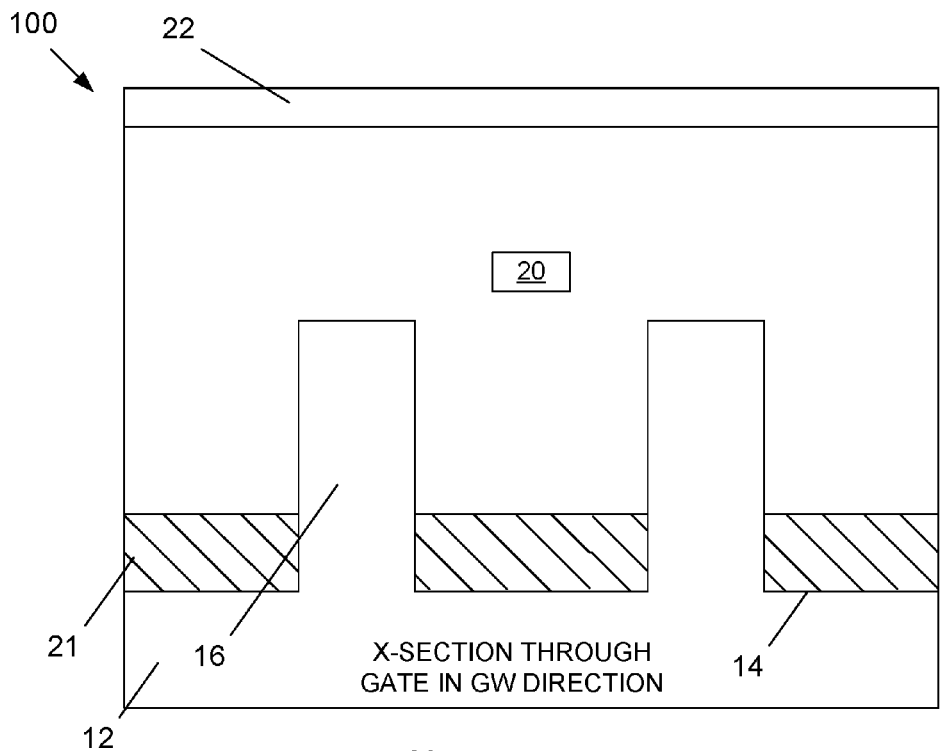
Figure 5C:
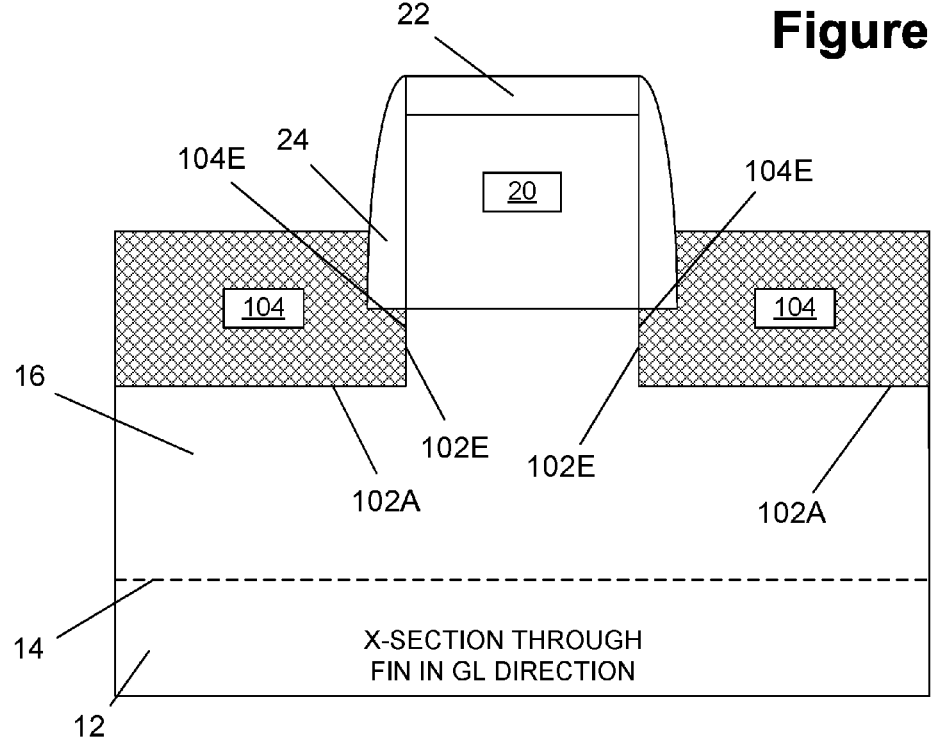

FIG. 5C depicts the device 100 after the above-described epi semiconductor material 104 was formed in the trenches 102A by performing a traditional epi growth process, i.e., embedded source/drain regions were formed for the device 100. The inward edge regions 104E of the epi semiconductor material 104 coincide with the inward edge regions 102E of the trenches 102A. In one embodiment, the inward edges 104E of epi semiconductor material 104 will extend laterally under substantially the entire width of the spacers 24 such that the inward edges 104E of the epi semiconductor material 104 are positioned adjacent or near the channel region of the device 100. As before, various ion implant regions would have been formed in the fins 16/substrate 12 at this point in the process flow, e.g., halo implants, extension implants, well implants, etc.

FIG. 5D depicts the device 100 after several process operations were performed. First, the above-described layer of insulating material 106 was formed on the device 100 above the epi semiconductor material 104. Thereafter, one or more CMP processes were performed to planarize the upper surface of the layer of insulating material 106 with the upper surface of the sacrificial gate structure 20. Then, one or more etching processes were performed to remove the sacrificial gate structure 20 relative to the surrounding structures and thereby define the replacement gate cavity 108. The removal of the sacrificial gate structure 20 exposes the upper surface 16S of the fin 16 within the gate cavity 108.

FIG. 5E depicts the device 100 after several process operations were performed. First, the above-described replacement channel cladding material 110 was formed on the portions of the fin 16 exposed within the gate cavity 108. Next, the above-described replacement gate structure 112 and gate cap layer 114 were formed in the replacement gate cavity 108 of the device 100 above the replacement channel cladding material 110 using well-known techniques. At the point of fabrication depicted in FIG. 5E, traditional manufacturing techniques may be performed to complete the manufacture of the device 100.

After a complete reading of the present application, those skilled in the art will appreciate that various aspects of the illustrative examples depicted in the attached drawings may be combined in certain applications if desired. For example, the formation of the recesses 119 under the spacers 24 (FIGS. 4A-4G) may be combined with the formation of the laterally enlarged trenches (5A-5G) to insure connection between the source/drain regions and the replacement cladding material 110.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a FinFET device with a channel region, the method comprising:
    forming an initial fin in a semiconductor substrate;
    forming a sacrificial gate structure around a portion of said initial fin;
    forming a sidewall spacer adjacent opposite sides of said sacrificial gate structure;
    removing said sacrificial gate structure so as to thereby define a replacement gate cavity that is laterally defined by said sidewall spacers, wherein formation of said replacement gate cavity exposes a portion of said initial fin within said replacement gate cavity;
    performing an etching process through said replacement gate cavity to remove portions of said initial fin so as to thereby define a reduced size fin and recesses under said sidewall spacers;
    forming at least one replacement epi semiconductor cladding material around said reduced size fin in said replacement gate cavity and in said recesses under said sidewall spacers; and
    forming a replacement gate structure within said replacement gate cavity around said at least one replacement epi semiconductor cladding material.

2. The method of claim 1, wherein said forming said at least one replacement epi semiconductor cladding material around said reduced size fin in said replacement gate cavity and in said recesses under said sidewall spacers comprises forming a single layer of epi semiconductor cladding material around said reduced size fin in said replacement gate cavity and in said recesses under said sidewall spacers.

3. The method of claim 1, wherein said at least one replacement epi semiconductor cladding material is comprised of at least one of $Si_{(1-x)}Ge_{(x)}$ (where "x" ranges from 0.1-0.9), a III-V material, InGaAs, GaAs, InAs, GaSb, InSbAs or silicon.

4. The method of claim 1, wherein said performing said etching process through said replacement gate cavity to remove portions of said fin so as to thereby define said reduced size fin and said recesses under said sidewall spacers comprises performing an isotropic etching process.

5. The method of claim 1, wherein said recesses extend under an entire lateral width of said sidewall spacers.

6. The method of claim 1 wherein said recesses extend only partially under said sidewall spacers.

7. The method of claim 1, wherein said substrate is a silicon substrate.

8. The method of claim 1, wherein said performing said etching process through said replacement gate cavity to remove portions of said initial fin so as to thereby define said reduced size fin comprises performing said etching process through said replacement gate cavity to remove portions of said initial fin so as to thereby define said reduced size fin with a width and a height that is less than a width and a height, respectively, of said initial fin.

9. A method of forming a FinFET device with a channel region, the method comprising:
    forming an initial fin in a semiconductor substrate;
    forming a sacrificial gate structure around a portion of said initial fin;
    forming a sidewall spacer adjacent opposite sides of said sacrificial gate structure;
    removing said sacrificial gate structure so as to thereby define a replacement gate cavity that is laterally defined by said sidewall spacers, wherein formation of said replacement gate cavity exposes a portion of said initial fin within said replacement gate cavity;
    performing an etching process through said replacement gate cavity to remove portions of said initial fin so as to thereby define a reduced size fin and full width recesses that extend under an entire width of each of said sidewall spacers, said reduced size fin having a width and a height that is less than a width and a height, respectively, of said initial fin;
    forming at least one replacement epi semiconductor cladding material around said reduced size fin in said replacement gate cavity so as to substantially fill said full width recesses under said sidewall spacers; and
    forming a replacement gate structure within said replacement gate cavity around said at least one replacement epi semiconductor cladding material.

10. The method of claim 9, wherein said forming said at least one replacement epi semiconductor cladding material around said reduced size fin in said replacement gate cavity and in said recesses under said sidewall spacers comprises forming a single layer of epi semiconductor cladding material around said reduced size fin in said replacement gate cavity and in said recesses under said sidewall spacers.

11. The method of claim 9, wherein said performing said etching process through said replacement gate cavity to remove portions of said fin so as to thereby define said reduced size fin and said full width recesses under said sidewall spacers comprises performing an isotropic etching process.

12. A FinFET transistor device comprising a channel region and source/drain regions, the device comprising:
    a plurality of trenches that define a fin in a semiconducting substrate, a portion of said fin in said source/drain regions having a first height and a first width;

a recessed layer of insulating material positioned in said trenches that exposes a portion of said fin;

a gate structure and sidewall spacers positioned on opposite sides of said gate structure, wherein said portion of said fin positioned under said gate structure and at least a portion of said sidewall spacers is a reduced size fin having a second height and a second width, said second height being less than said first height and said second width being less than said first width;

epi source/drain regions positioned around portions of said fin positioned laterally outside said sidewall spacers; and a channel epi semiconductor cladding material positioned around said reduced size fin, under said gate structure and at least partially under said sidewall spacers.

13. The device of claim 12, wherein said channel epi semiconductor cladding material is a single layer of epi semiconductor cladding material.

14. The device of claim 12, wherein said channel epi semiconductor cladding material comprises multiple layers of epi semiconductor cladding material.

15. The device of claim 12, wherein said channel epi semiconductor cladding material extends entirely under said sidewall spacers.

16. The device of claim 12, wherein said channel epi semiconductor cladding material is comprised of one of $Si_{(1-x)}Ge_{(x)}$ (where "x" ranges from 0.1-0.9), a III-V material, InGaAs, GaAs, InAs, GaSb, InSbAs or silicon.

17. The device of claim 12, wherein said gate structure is comprised of a high-k gate insulation layer and at least one layer of metal.

18. The device of claim 12, wherein said channel epi semiconductor cladding material positioned around said reduced size fin contacts said epi source/drain regions.

* * * * *